United States Patent
Seo et al.

(10) Patent No.: US 8,921,816 B2
(45) Date of Patent: Dec. 30, 2014

(54) SEMICONDUCTOR DEVICE HAVING A DIODE

(75) Inventors: Bo-Young Seo, Suwon-si (KR);
Byung-Suo Shim, Yongin-si (KR);
Yong-Kyu Lee, Gwacheon-si (KR);
Tea-Kwang Yu, Hwaseong-si (KR);
Ji-Hoon Park, Seongnam-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 289 days.

(21) Appl. No.: 13/178,762

(22) Filed: Jul. 8, 2011

(65) Prior Publication Data

US 2012/0007212 A1    Jan. 12, 2012

(30) Foreign Application Priority Data

Jul. 9, 2010  (KR) .................. 10-2010-0066438

(51) Int. Cl.
*H01L 29/02* (2006.01)
*H01L 27/24* (2006.01)
*H01L 27/102* (2006.01)
*H01L 45/00* (2006.01)

(52) U.S. Cl.
CPC ........ *H01L 27/1021* (2013.01); *H01L 27/2463* (2013.01); *H01L 45/06* (2013.01); *H01L 27/2409* (2013.01)
USPC .................. 257/2; 257/E45.002; 257/E47.001

(58) Field of Classification Search
CPC ............... H01L 27/2409; H01L 45/06; H01L 21/76229
USPC ........................ 257/2, 4, 5, E45.002, E47.001
See application file for complete search history.

(56) References Cited

U.S. PATENT DOCUMENTS

| | | | |
|---|---|---|---|
| 6,350,655 B2 * | 2/2002 | Mizuo | 438/296 |
| 6,437,383 B1 | 8/2002 | Xu | |
| 6,646,297 B2 | 11/2003 | Dennison | |
| 7,800,093 B2 * | 9/2010 | Happ et al. | 257/4 |

FOREIGN PATENT DOCUMENTS

KR    1020090088007    8/2009

* cited by examiner

*Primary Examiner* — David Vu
(74) *Attorney, Agent, or Firm* — Ellsworth IP Group PLLC

(57) ABSTRACT

Provided is a semiconductor device. The semiconductor device includes a lower active region on a semiconductor substrate. A plurality of upper active regions protruding from a top surface of the lower active region and having a narrower width than the lower active region are provided. A lower isolation region surrounding a sidewall of the lower active region is provided. An upper isolation region formed on the lower isolation region, surrounding sidewalls of the upper active regions, and having a narrower width than the lower isolation region is provided. A first impurity region formed in the lower active region and extending into the upper active regions is provided. Second impurity regions formed in the upper active regions and constituting a diode together with the first impurity region are provided. A method of fabricating the same is provided as well.

20 Claims, 20 Drawing Sheets

SEMICONDUCTOR DEVICE HAVING A DIODE

CROSS-REFERENCE TO RELATED APPLICATIONS

This application claims the benefit of priority under 35 U.S.C. §119 to Korean Patent Application No. 10-2010-0066438 filed on Jul. 9, 2010, the disclosure of which is hereby incorporated by reference in its entirety.

BACKGROUND OF THE INVENTION

1. Field of the Invention

Embodiments of the present general inventive concept relate to a semiconductor device having a diode formed in a substrate, and in particular to a semiconductor device having a memory cell including a diode connected to an information storage element.

2. Description of the Related Art

In order to meet demand for a semiconductor memory device exhibiting high-performance and operating at low power, next generation semiconductor memory devices such as a ferroelectric random access memory (FRAM), a magnetic random access memory (MRAM) and a phase-change random access memory (PRAM) have been developed.

SUMMARY OF THE INVENTION

Embodiments of the general inventive concept provide a semiconductor device having a diode formed in a substrate.

Embodiments of the general inventive concept also provide a method of fabricating a semiconductor device capable of forming a diode without using a high-temperature epitaxial process.

Additional aspects and advantages of the present general inventive concept will be set forth in part in the description which follows and, in part, will be obvious from the description, or may be learned by practice of the general inventive concept.

The technical objectives of the general inventive concept are not limited to the above disclosure; other objectives may become apparent to those of ordinary skill in the art based on the following descriptions.

Features of the general inventive concept may be realized by a semiconductor device including a lower active region on a semiconductor substrate. A plurality of upper active regions protruding from a top surface of the lower active region and having a narrower width than the lower active region are provided. A lower isolation region surrounding a sidewall of the lower active region is provided. An upper isolation region formed on the lower isolation region, surrounding sidewalls of the upper active regions, and having a narrower width than the lower isolation region is provided. A first impurity region formed in the lower active region and extending into the upper active regions is provided. Second impurity regions formed in the upper active regions and constituting a diode together with the first impurity region are provided.

In some embodiments, the first impurity region may be an N-type impurity region, and the second impurity regions may be P-type impurity regions.

In other embodiments, each of the second impurity regions may include a lower impurity region and an upper impurity region having a higher concentration than the lower impurity region, the lower impurity region being interposed between the first impurity region and the upper impurity region.

In still other embodiments, the first impurity region may be disposed at a higher level than a bottom surface of the lower isolation region and may be in a line shape in a plan view.

In yet other embodiments, the first impurity region and the second impurity region may have a junction in an uneven form therebetween.

In yet other embodiments, the first impurity region and the second impurity region may have a junction in the shape of a horizontal line.

In yet other embodiments, the lower isolation region may include a polysilicon layer and an insulating layer surrounding a sidewall and bottom surface of the polysilicon layer.

In yet other embodiments, the upper isolation region may include an insulating upper isolation layer and an insulating spacer interposed between the upper isolation layer and the upper active regions.

In yet other embodiments, the lower active region may be in a line shape in a plan view, and each of the upper active regions may have a narrower width than the lower active region and may upwardly protrude from a top surface of the lower active region.

In yet other embodiments, the device may further include: a lower electrode electrically connected to the second impurity region; an upper electrode on the lower electrode; and an information storage material pattern between the upper electrode and the lower electrode.

Features of the general inventive concept may also be realized by a semiconductor device including a lower isolation region provided in a semiconductor substrate and defining lower active regions in the shape of lines spaced apart from each other. An upper isolation region defining a plurality of upper active regions protruding from top surfaces of the lower active regions, and having a greater width than the lower isolation region is provided. First impurity regions formed in the lower active regions and extending into the upper active regions are provided. Second impurity regions formed in the upper active regions and constituting a diode together with the first impurity regions are provided.

In some embodiments, the first and second impurity regions may have a junction disposed in the upper active regions.

In other embodiments, the first impurity regions may be N-type impurity regions, and the second impurity regions may be P-type impurity regions.

In still other embodiments, each of the second impurity regions may include a lower impurity region and an upper impurity region having a higher concentration than the lower impurity region, and the lower impurity region may be interposed between the first impurity regions and the upper impurity region.

In yet other embodiments, the first impurity regions may be disposed at a higher level than a bottom surface of the lower isolation region.

In yet other embodiments, the first and second impurity regions may have a junction in an uneven form therebetween.

In yet other embodiments, the lower isolation region may include a polysilicon layer and an insulating oxide layer surrounding a sidewall and bottom surface of the polysilicon layer.

In yet other embodiments, the upper isolation region may include an insulating upper isolation layer and an insulating spacer interposed between the upper isolation layer and the upper active regions.

In yet other embodiments, the device may further include: lower electrodes electrically connected to the second impurity regions; upper electrodes on the lower electrodes; and an information storage material pattern between the lower electrodes and the upper electrodes.

Features of the present general inventive concept may also be realized by a semiconductor device having an information storage material pattern. The semiconductor device includes a lower isolation region provided in a P-type semiconductor substrate and defining lower active regions in the shape of lines spaced apart from each other. An upper isolation region defining a plurality of upper active regions protruding from top surfaces of the lower active regions, and having a greater width than the lower isolation region is provided. N-type first impurity regions formed in the lower active regions and extending into the upper active regions are provided. P-type second impurity regions formed in the upper active regions and constituting a diode together with the first impurity regions are provided. Lower electrodes electrically connected to the second impurity regions are provided. Upper electrodes are provided on the lower electrodes. Information storage material patterns interposed between the lower electrodes and the upper electrodes are provided. Conductive patterns electrically connected to the upper electrodes are provided. Each of the second impurity regions includes a lower impurity region and an upper impurity region having a higher concentration than the lower impurity region. The conductive patterns and the first impurity regions have an orientation crossing each other.

Features of the present general inventive concept may also be realized by a semiconductor device including a substrate having a first surface and a second surface opposite the first surface, a plurality of upper isolation regions extending into the substrate from the first surface to define an upper active region between the plurality of first isolation regions, a plurality of lower isolation regions extending toward the second surface from the plurality of upper isolation regions to define a lower active region between the plurality of lower isolation regions, and the plurality of lower isolation regions having widths less than widths of the upper isolation regions, a first impurity region located in at least the lower active region, and a second impurity region formed in the upper active region to, in combination with the lower impurity region, form a diode.

The device may further include an information storage material pattern connected to the upper active region.

The first impurity region may be a line extending through the substrate in a direction crossing a direction of the information storage material pattern.

The device may further include a lower electrode connected to the upper active region, and an upper electrode connected to the lower electrode, wherein the information storage material pattern is connected between the lower electrode and the upper electrode.

A junction of the first impurity region and the second impurity region is located in the upper active region.

A lower edge of the first impurity region between two of the plurality of lower isolation regions may have a concave shape.

The second impurity region may include an upper impurity region adjacent to the first surface of the substrate and a lower impurity region between the upper impurity region and the first impurity region.

A border between the lower impurity region and the second impurity region may have a concave shape.

The upper impurity region may be a high-concentration impurity region and the lower impurity region is a low-concentration impurity region.

Features of the present general inventive concept may also be realized by a solid-state disk, including an interface to transmit data to and from a host device, non-volatile memory to store data, and a controller to control access of the host device to the non-volatile memory. The non-volatile memory may include a substrate having a first surface and a second surface opposite the first surface, a plurality of upper isolation regions extending into the substrate from the first surface to define an upper active region between the plurality of first isolation regions, a plurality of lower isolation regions extending toward the second surface from the plurality of upper isolation regions to define a lower active region between the plurality of lower isolation regions, and the plurality of lower isolation regions having widths less than widths of the upper isolation regions, a first impurity region located in at least the lower active region, a second impurity region formed in the upper active region to, in combination with the lower impurity region, form a diode, and an information storage material pattern connected to the upper active region.

The first impurity region may be a word line that extends through the substrate to connect a plurality of lower active regions

BRIEF DESCRIPTION OF THE DRAWINGS

The foregoing and other features and advantages of the general inventive concept will be apparent from the more particular description of preferred embodiments of the general inventive concept, as illustrated in the accompanying drawings in which like reference characters refer to the same parts throughout the different views. The drawings are not necessarily to scale, emphasis instead being placed upon illustrating the principles of the general inventive concept. In the drawings.

DETAILED DESCRIPTION OF THE PREFERRED EMBODIMENTS

Figure 1:
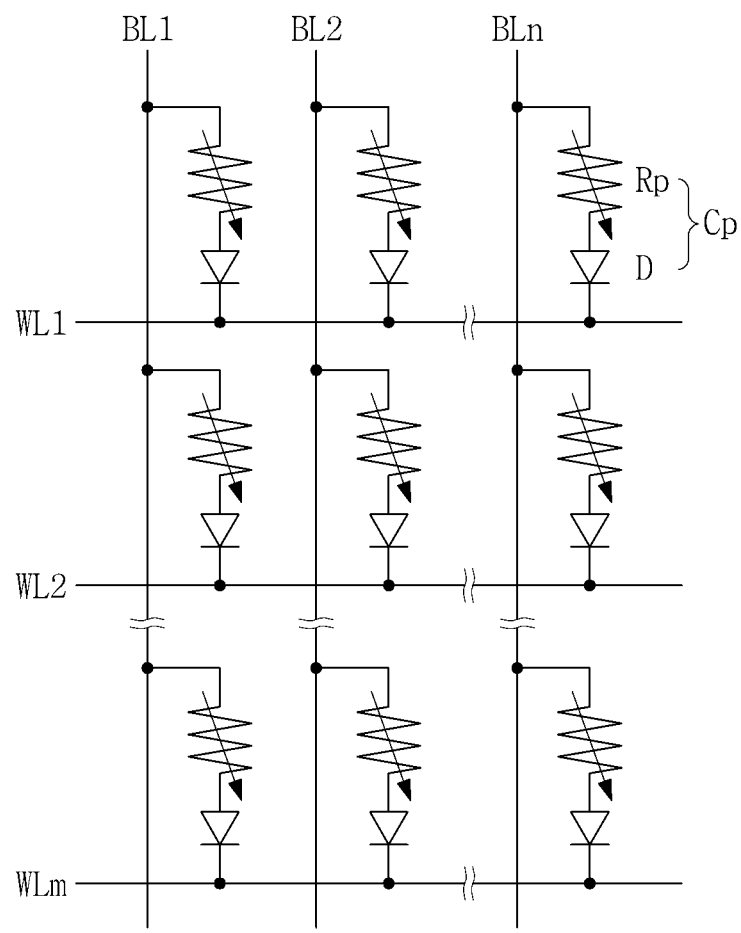
FIG. 1 is an equivalent circuit diagram of a memory cell employing a diode.

Advantages, features and a method of achieving them will now be described more fully with reference to the accompanying drawings in which some example embodiments are shown. This general inventive concept may, however, be embodied in different forms and should not be construed as limited to the embodiments set forth herein. Rather, these embodiments are provided so that this disclosure is thorough and complete and fully conveys the scope of the inventive concept to one skilled in the art. Further, the inventive disclosure is defined by the scope of the claims. In the drawings, the sizes and relative sizes of layers and regions may be exaggerated for clarity.

Embodiments of the general inventive concept may be described with reference to schematic plan views or cross-sectional views, which are schematic views of idealized example embodiments of the inventive disclosure. As such, variations from the shapes of the illustrations, as a result, for example, of manufacturing techniques and/or tolerances, are to be expected. Thus, example embodiments of the inventive disclosure should not be construed as being limited to the particular shapes of regions illustrated herein, but are to include deviations in shapes that result from, e.g., a manufacturing process. Thus, the regions illustrated in the drawings are schematic in nature and are not intended to limit the scope of the inventive concept.

First, a semiconductor memory device according to embodiments of the general inventive concept will be schematically described with reference to FIG. 1, which is an equivalent circuit diagram of a memory cell employing a diode.

Referring to FIG. 1, a memory device may include a plurality of word lines WL1, WL2, . . . , WLm and a plurality of bit lines BL1, BL2, . . . , BLn intersecting at a cell array region. Here, "m" and "n" may respectively denote positive integers.

Memory cells Cp may be provided at cross points of the word lines WL1, WL2, . . . , WLm and the bit lines BL1, BL2, . . . , BLn. Each of the memory cells Cp may include an information storage element Rp and a diode D electrically connected to each other. One side of the information storage element Rp may be electrically connected to a P-type semiconductor of the diode D and the other side of the information storage element Rp may be electrically connected to one of the bit lines BL1, BL2, . . . , BLn. Also, an N-type semiconductor of the diode D may be electrically connected to one of the word lines WL1, WL2, . . . , WLm.

Each of the information storage elements Rp may be a resistance memory element that exhibits at least two distinguishable resistance states, e.g., a high resistance and a low resistance, depending on an applied signal. For example, the resistance memory element may include a perovskite memory element, a phase-change memory element, a magnetic memory element, a conductive metal oxide (CMO) memory element, a solid electrolyte memory element, and a polymer memory element. The perovskite memory element may include a colossal magnetoresistive (CMR) material, a high-temperature superconducting (HTSC) material, etc. The solid electrolyte memory element may include metal ions that are movable in a solid electrolyte, and thus may include a material capable of forming conductive bridging.

Embodiments of the general inventive concept in which a phase-change memory element is employed as an information storage element Rp will be described below as an example. Therefore, the following descriptions may be applied to a semiconductor device that employs the above-described various memory elements.

Figure 2:
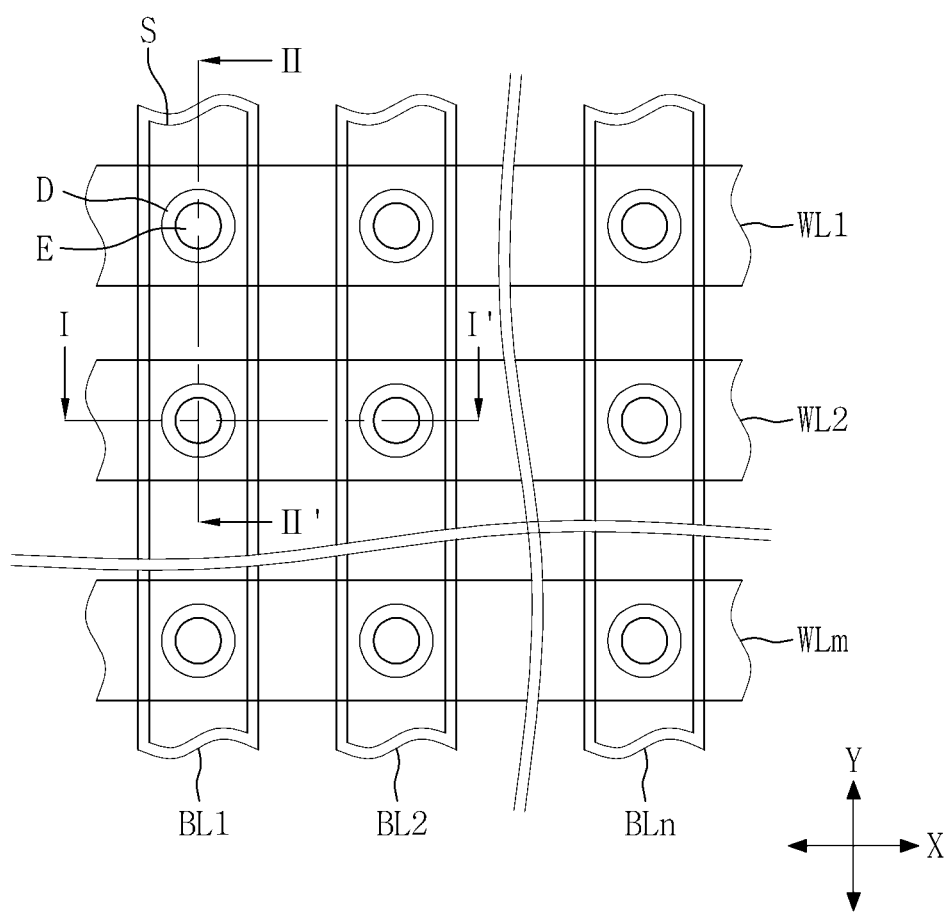
FIG. 2 is a plan view of a semiconductor device according to embodiments of the general inventive concept.
Figure 3A:
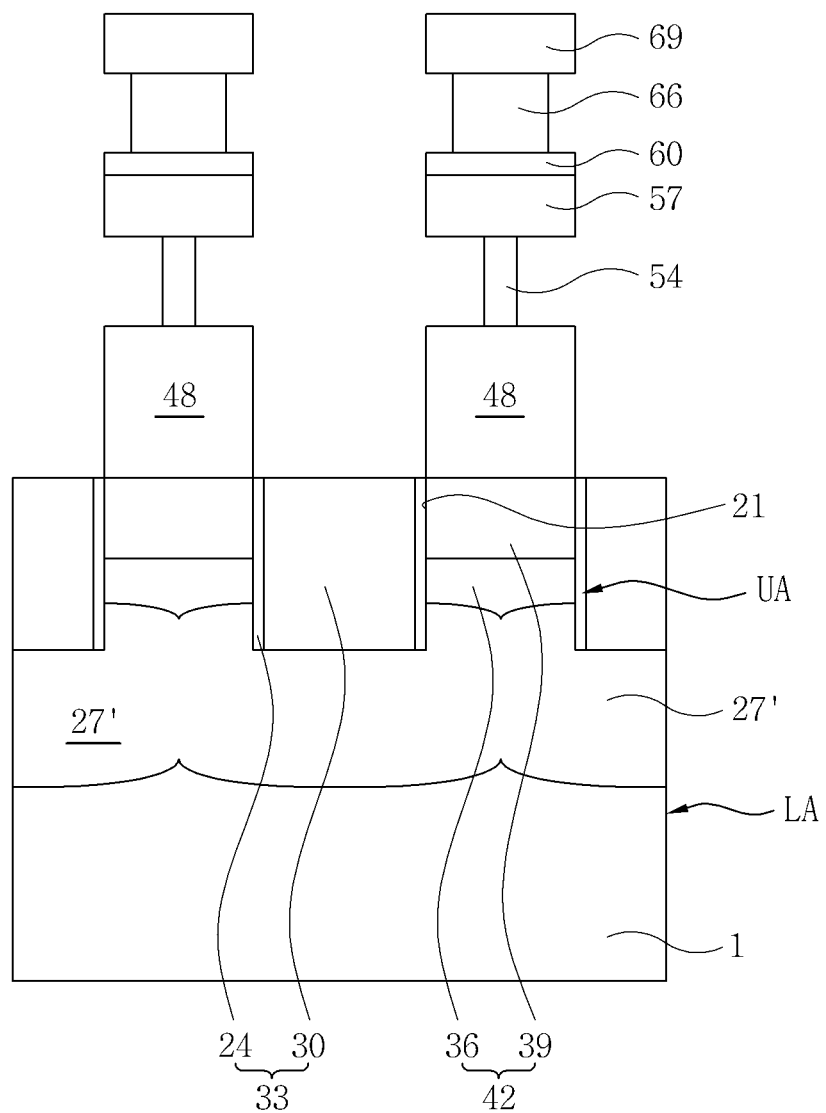
FIGS. 3A and 3B are cross-sectional views of a semiconductor device according to one embodiment of the general inventive concept.
Figure 3B:
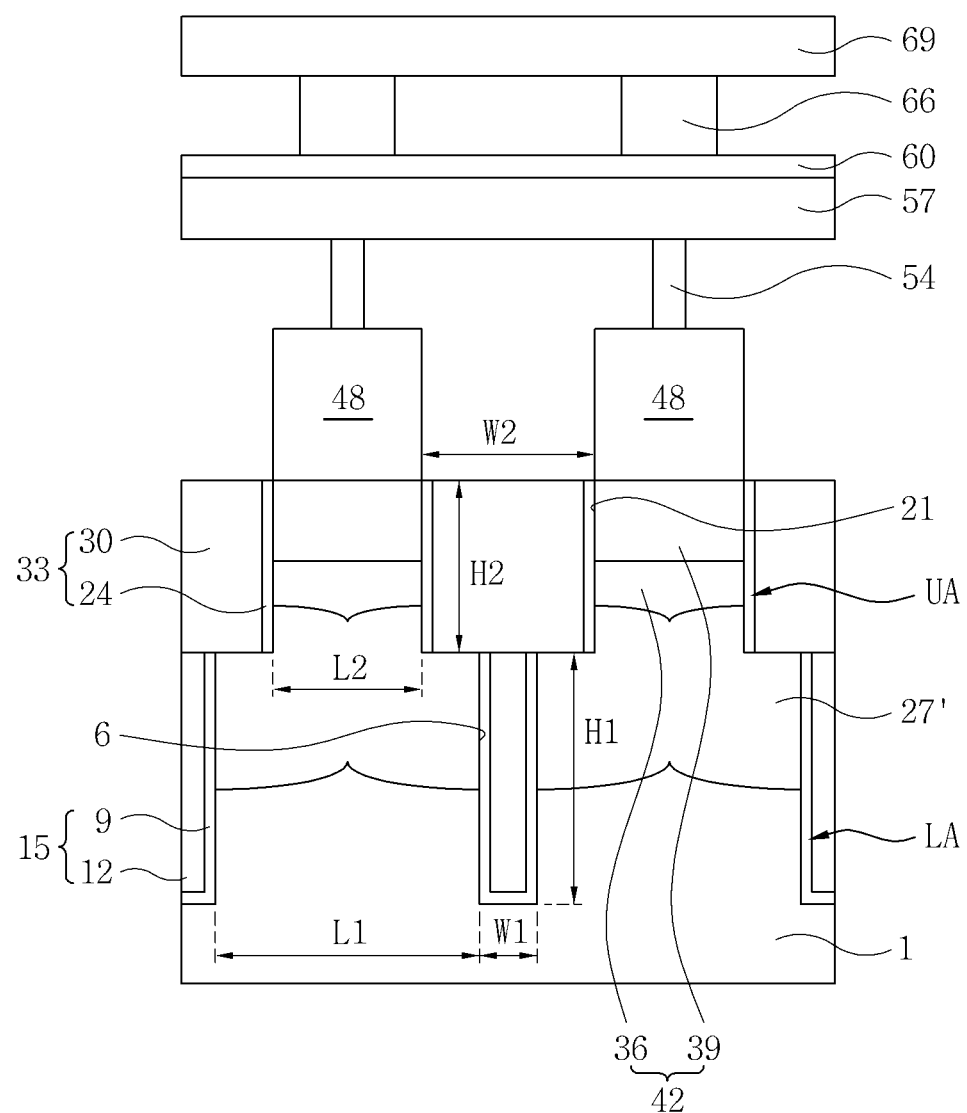
Figure 4A:
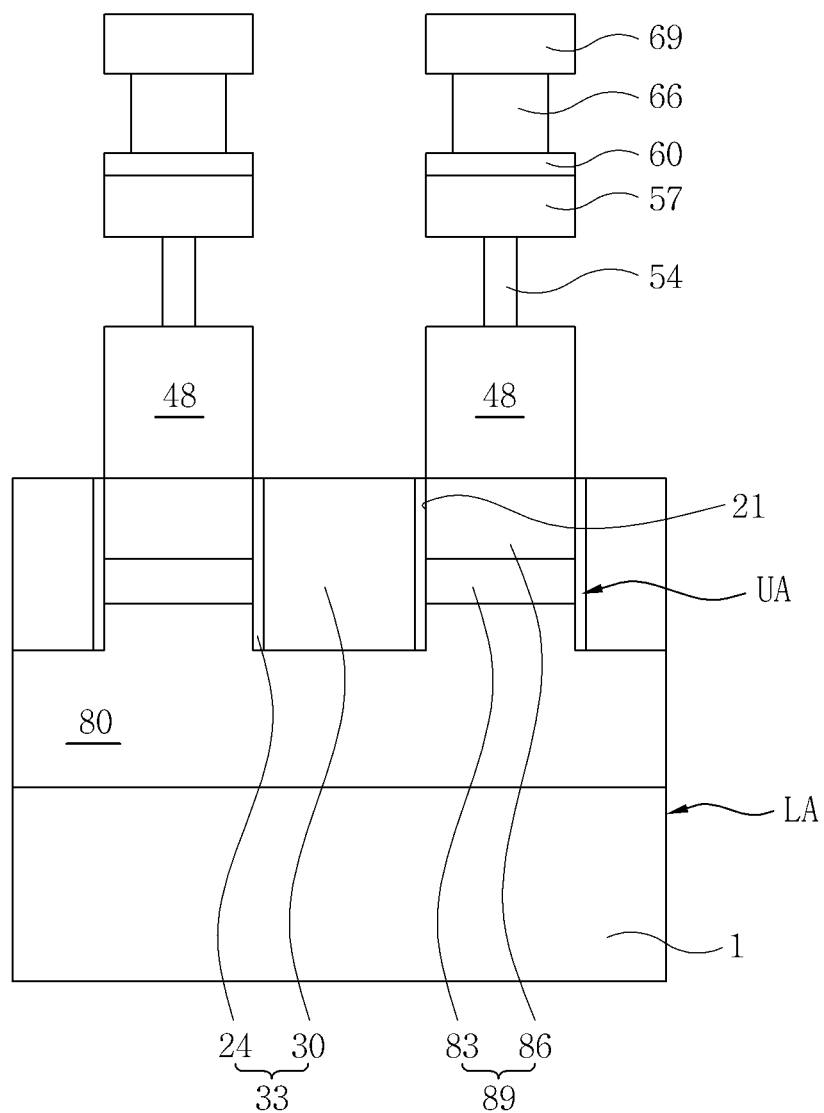
FIGS. 4A and 4B are cross-sectional views of a semiconductor device according to another embodiment of the general inventive concept.
Figure 4B:
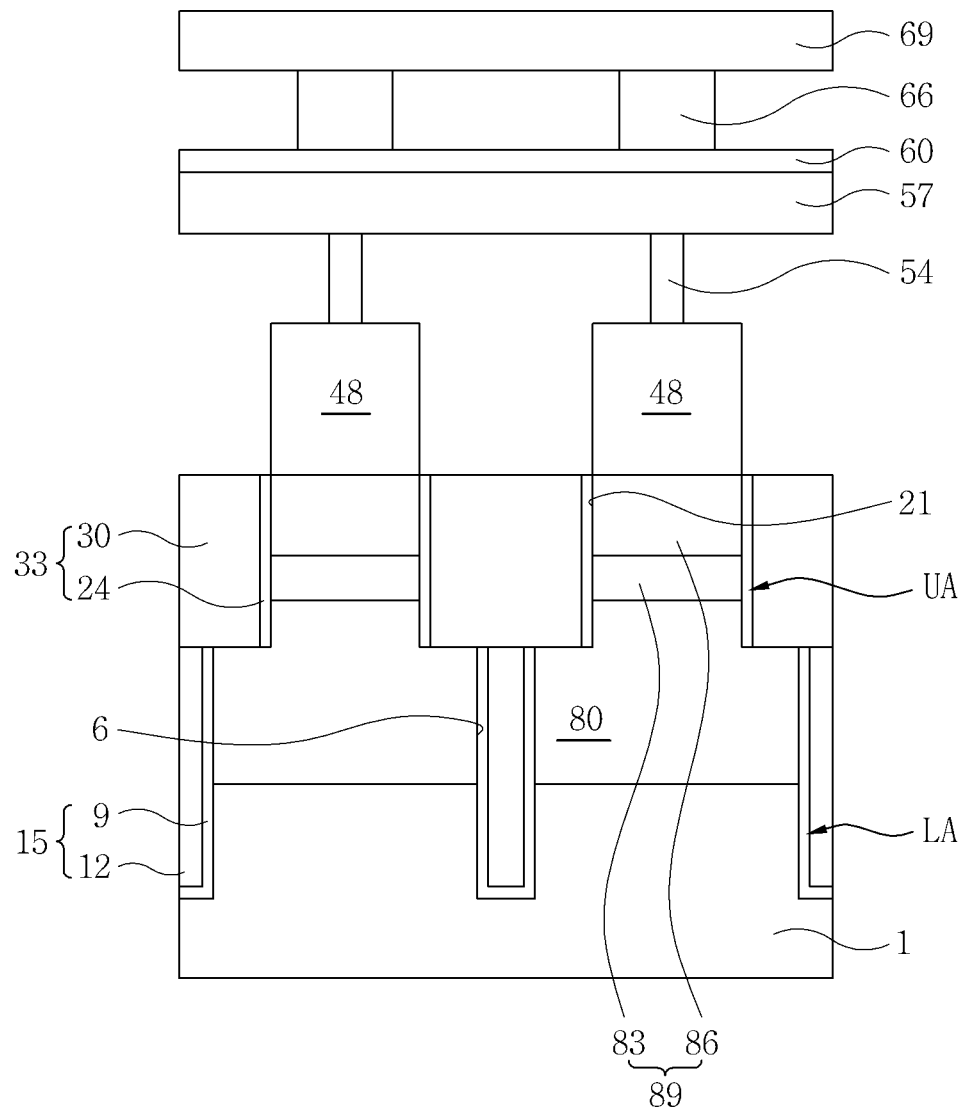

FIG. 2 is a plan view of a semiconductor device according to embodiments of the general inventive concept, FIGS. 3A and 3B are cross-sectional views of a semiconductor device according to one embodiment of the general inventive concept, and FIGS. 4A and 4B are cross-sectional views of a semiconductor device according to another embodiment of the general inventive concept. In FIGS. 3A to 4B, FIGS. 3A and 4A are cross-sectional views taken along line I-I' of FIG. 2, and FIGS. 3B and 4B are cross-sectional views taken along line II-II' of FIG. 2.

First, a semiconductor device according to one embodiment of the general inventive concept will be described with reference to FIGS. 2, 3A and 3B.

Referring to FIGS. 2, 3A and 3B, a semiconductor substrate 1 may be provided. The semiconductor substrate 1 may be a silicon substrate.

A lower isolation region 15 defining lower active regions LA may be provided in the semiconductor substrate 1. The lower isolation region 15 may include a lower isolation layer 12 and an insulating oxide layer 9 surrounding a sidewall and bottom surface of the lower isolation layer 12. The oxide layer 9 may be a silicon oxide layer formed by a thermal oxidation process. The lower isolation layer 12 may be formed of a silicon layer. For example, the lower isolation layer 12 may be formed of a polysilicon layer. Alternatively, the lower isolation layer 12 may be formed of a silicon oxide layer.

An upper isolation region 33 defining upper active regions UA spaced apart from each other may be provided in the semiconductor substrate 1. Each of the lower active regions LA may be formed to a first width L1, and each of the upper active regions UA may be formed to a second width L2 smaller than the first width L1. Sidewalls of the lower active regions LA may not be vertically aligned with those of the upper active regions UA. In other words, the sidewalls of the lower active regions LA may be offset from the sidewalls of the upper active region UA in the horizontal direction.

The upper isolation region 33 may be formed to a width W2 greater than the width W1 of the lower isolation region 15. The upper active regions UA may be shaped to upwardly protrude from parts of the lower active regions LA.

The upper isolation region 33 may include an insulating upper isolation layer 30 and insulating spacers 24 interposed between the upper isolation layer 30 and the upper active regions UA. The spacers 24 may be formed of an insulating material such as silicon oxide or silicon nitride. The spacers 24 may be spaced apart from the lower isolation region 15. The height H2 of the upper isolation region 33 may be smaller than the height H1 of the lower isolation region 15.

First impurity regions 27' provided in the lower active regions LA and extending into the upper active regions UA may be provided. The first impurity regions 27' may be disposed at a higher level than a bottom surface of the lower isolation region 15.

Second impurity regions 42 may be provided in the remaining regions of the upper active regions UA in which the first impurity regions 27' are not formed. The first impurity regions 27' and the second impurity regions 42 may constitute a diode as illustrated in FIGS. 1 and 2. For example, the first impurity regions 27' may be formed of N+-type impurity regions having a different conductivity from the semiconductor substrate 1 having a P-type conductivity, and the second impurity regions 42 may be formed of P-type impurity regions.

Since a junction between the first impurity regions 27' and the second impurity regions 42 may be disposed in the upper active regions UA having a narrower width than the lower active regions LA, electrical properties of a diode used as a switching device in a memory device may be enhanced.

In some embodiments, each of the second impurity regions 42 may include a lower impurity region 36 and an upper impurity region 39 having a higher concentration than the lower impurity region 36. The lower impurity region 36 may be interposed between the upper impurity region 39 and the first impurity region 27'.

A junction between the first impurity regions 27' and the second impurity regions 42 may be uneven. Viewed from a vertical cross-sectional view, the junction between the first impurity regions 27' and the second impurity regions 42 may be in the shape of a bent line. For example, the junction between the first impurity regions 27' and the second impurity regions 42 may have a central portion that is downwardly concave.

The first impurity regions 27' may correspond to the word lines WL1, WL2, . . . , WLm of FIGS. 1 and 2, and may be in the shape of a line. The lower isolation regions 15 disposed at both sides of the first impurity regions 27' may be provided to have a narrower width than the upper isolation regions 33. Therefore, since the lower active regions LA and the first impurity regions 27' defined by the lower isolation regions 15 may be formed to have great widths, electrical properties of the first impurity regions 27' used as the word lines WL1, WL2, . . . , WLm may be enhanced. Thus, an overall response rate of the device may be improved.

Lower conductive patterns 48 electrically connected to the second impurity regions 42 may be provided. The lower conductive patterns 48 may include a metal-semiconductor compound such as CoSi, TiSi, IrSi, PtSi or NiSi forming ohmic contact with the second impurity regions 42 and a metal layer such as tungsten formed on the metal-semiconductor compound.

Lower electrodes 54 electrically connected to the lower conductive patterns 48 may be provided. The lower electrodes 54 may be formed of one selected from the group consisting of a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer and a combination thereof.

Information storage material patterns 57 and S and upper electrodes 60 which are sequentially stacked may be provided on the lower electrodes 54. The information storage material patterns 57 and S may include a phase-change material layer whose resistance to a flowing current varies depending on a phase. The phase-change material layer may be formed of a material layer including at least one of Te, Se, Ge, Sb, Bi, Pb, Sn, Ag, As, S, Si, P, O and C. For example, the phase-change material layer may be used for a phase-change memory cell in addition to a chalcogenide layer such as a GST layer. The upper electrodes 60 may be formed of one selected from the group consisting of a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and a combination thereof.

In some embodiments, the information storage material patterns 57 may be formed in the shape of lines spaced apart from each other. For example, viewed from a plan view, the information storage material patterns 57 may be formed in the shape of lines having a second orientation Y crossing the word lines WL1, WL2, . . . , WLm of the first orientation X. The information storage material patterns 57 may correspond to "S" of FIG. 2.

In other embodiments, the information storage material patterns 57 may be spaced apart from each other to be in an island type. Conductive upper plugs 66 electrically connected to the upper electrodes 60 may be provided. Conductive patterns 69 electrically connected to the conductive upper plugs 66 may be provided. The conductive patterns 69 may correspond to the bit lines BL1, BL2, . . . , BLn of FIGS. 1 and 2.

Viewed from a plan view, parts of the information storage material patterns 57 disposed at the cross points of the word lines WL1, WL2, . . . , WLm; 27' and the bit lines BL1, BL2, . . . , BLn; 69 may be defined as information storage elements Rp.

As previously described, the bottom surface and top surface of the first impurity regions 27' may be in a concave form. However, the first impurity regions 27' may be modified to impurity regions 80 formed of lines horizontally parallel to each other without the bottom surface or the top surface being concave as illustrated in FIGS. 4A and 4B.

As previously described, first and second impurity regions 27' and 42 constituting a diode and isolation regions 15 and 33 defining the first and second impurity regions 27' and 42 according to embodiments of the inventive concept may be provided. Since the first and second impurity regions 27' and 42 constituting a diode provide a structure that may be formed without a high-temperature epitaxial process, a deteriorated substrate caused by the process of forming the diode D may be prevented. Further, since the high-temperature process may be omitted, a memory device employing the diode D may be embedded in other devices. A method of fabricating a semiconductor device capable of forming the first and second impurity regions 27' and 42 constituting the diode without a high-temperature epitaxial process will be described below.

Figure 10A:
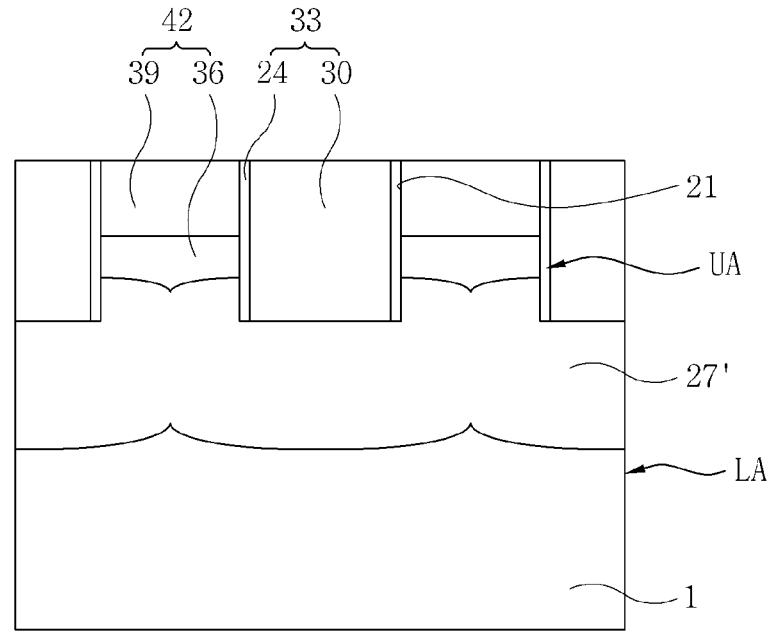
Figure 10B:
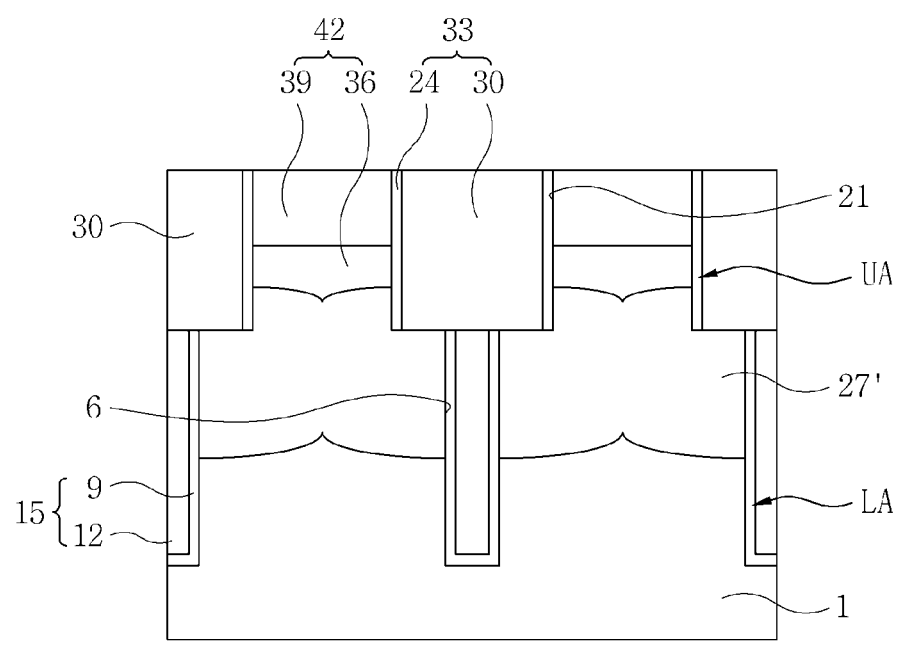
Figure 11A:
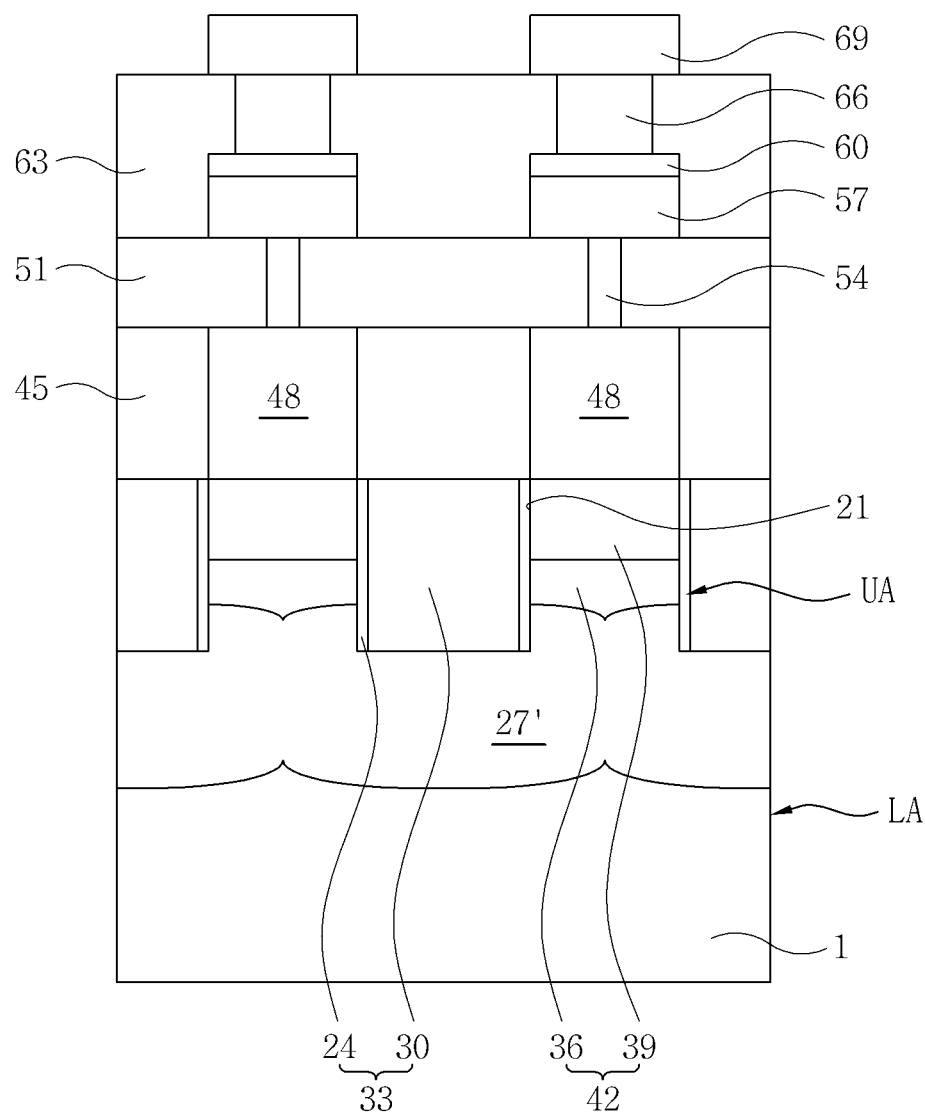
Figure 11B:
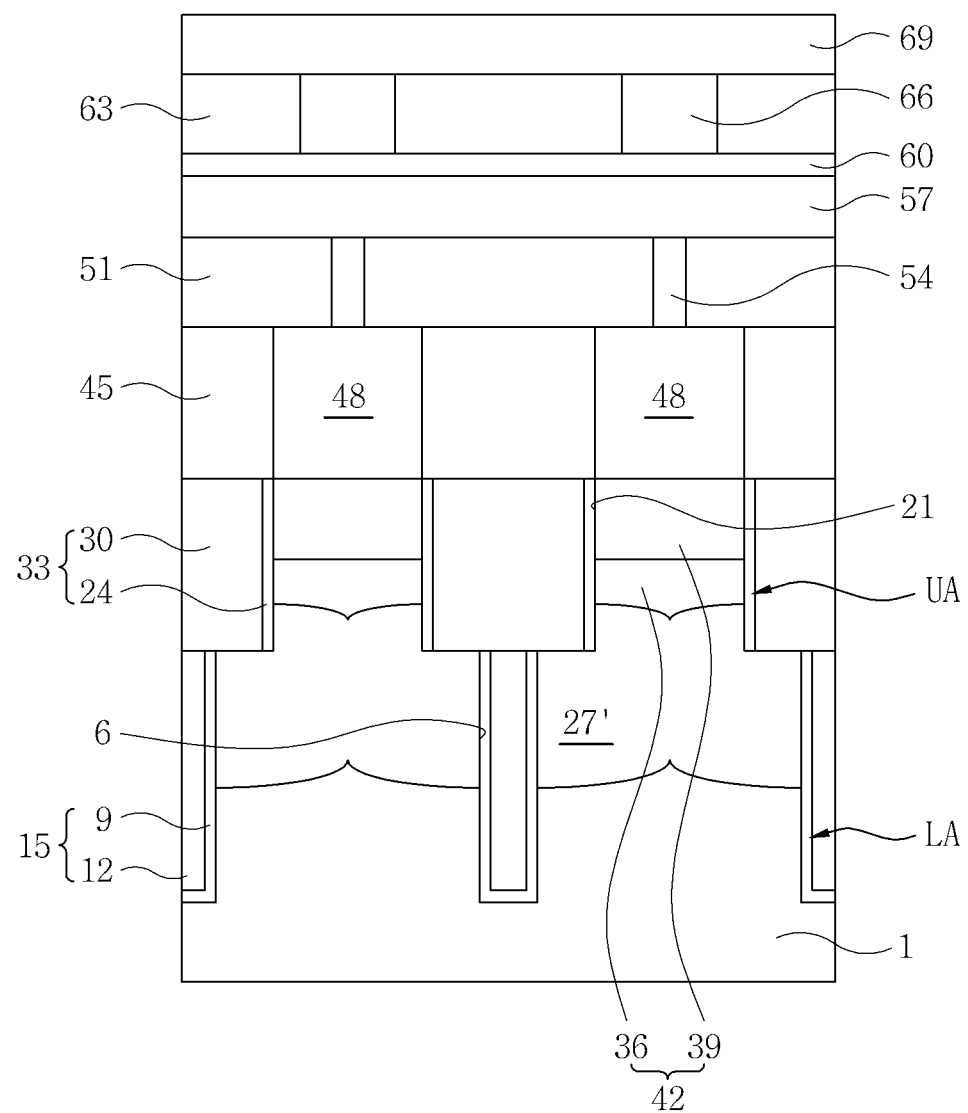
Figure 12A:
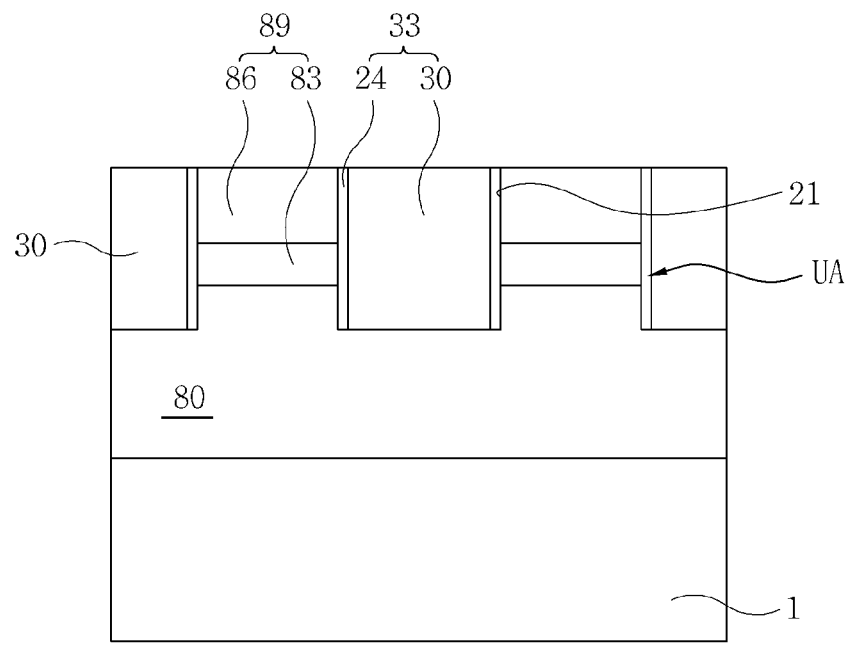
FIGS. 12A and 12B are cross-sectional views of a semiconductor device according to another embodiment of the general inventive concept.
Figure 12B:
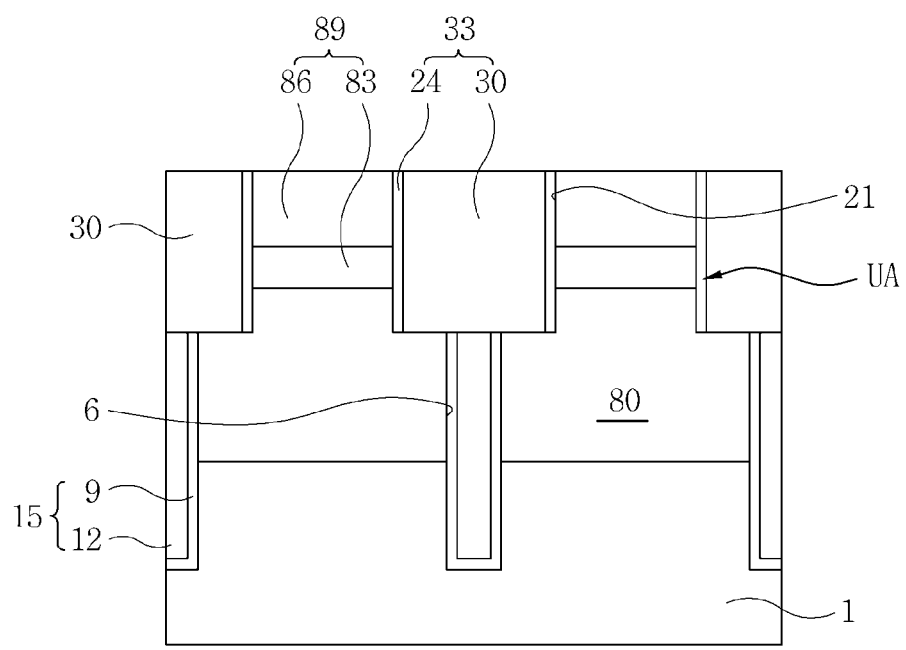

FIGS. 5A to 11B are cross-sectional views of a semiconductor device according to one embodiment of the inventive concept, FIGS. 12A and 12B are cross-sectional views of a semiconductor device according to another embodiment of the inventive concept, and FIGS. 13A to 15B are cross-sectional views of a semiconductor device according to still another embodiment of the inventive concept.

In FIGS. 3A to 15B, FIGS. 3A, 4A, 5A, 6A, 7A, 8A, 9A, 10A, 11A, 12A, 13A, 14A, and 15A are cross-sectional views taken along line I-I' of FIG. 2, and FIGS. 3B, 4B, 5B, 6B, 7B, 8B, 9B, 10B, 11B, 12B, 13B, 14B, and 15B are cross-sectional views taken along line II-II' of FIG. 2.

First, a method of fabricating a semiconductor device according to one embodiment of the inventive concept will be described with reference to FIGS. 2, and 5A to 11B.

Figure 5A:
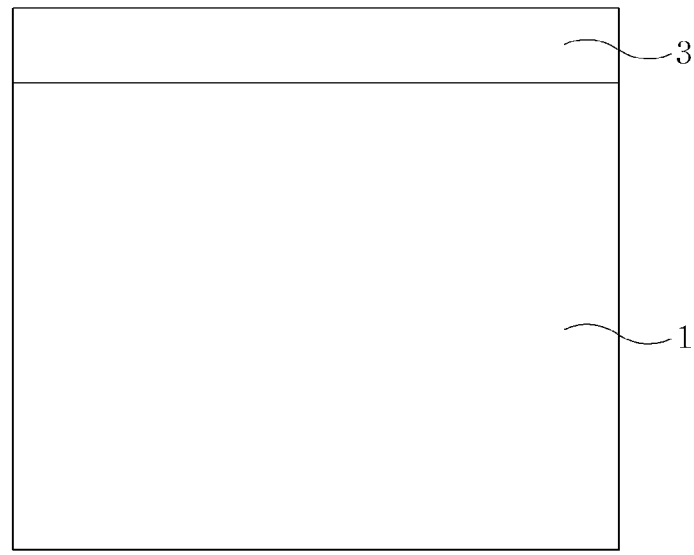
FIGS. 5A to 11B are cross-sectional views of a semiconductor device according to one embodiment of the general inventive concept.
Figure 5B:
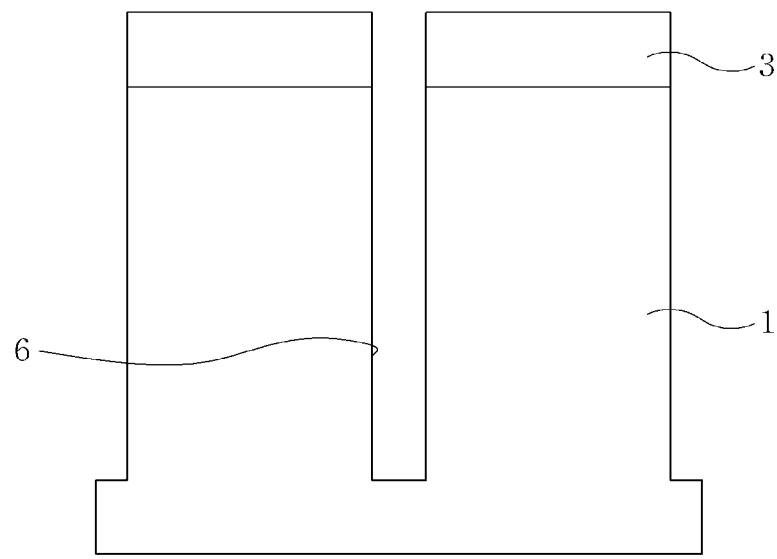

Referring to FIGS. 2, 5A and 5B, a semiconductor substrate 1 may be provided. The semiconductor substrate 1 may be a P-type silicon substrate. A first mask 3 may be formed on the semiconductor substrate 1. The first mask 3 may be a hard mask. For example, the first mask 3 may be formed of a buffer oxide layer and a silicon nitride layer which are sequentially stacked.

The semiconductor substrate 1 may be etched using the first mask 3 as an etch mask to form a lower trench region 6. Viewed from a plan view, the lower trench region 6 may be in the shape of a line.

Figure 6A:
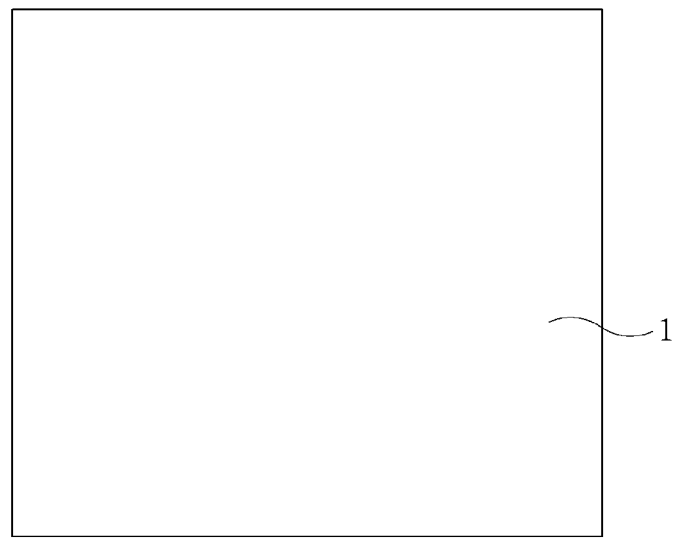
Figure 6B:
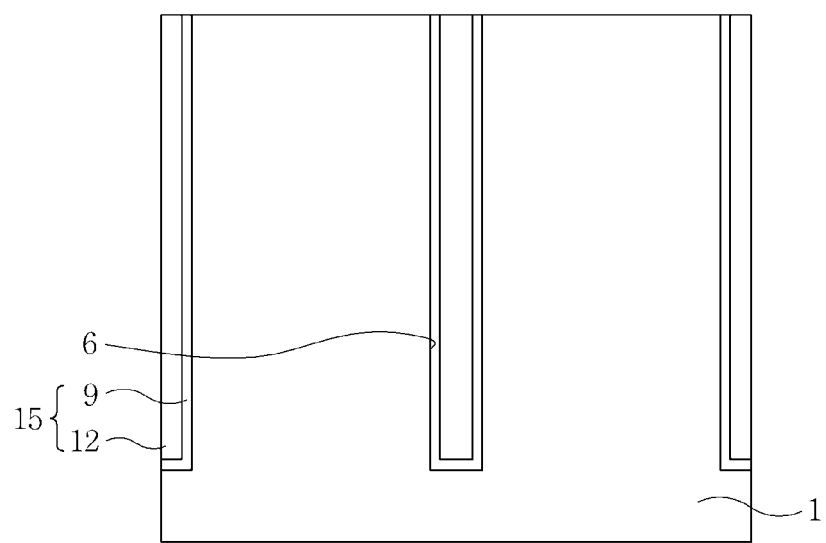

Referring to FIGS. 2, 6A and 6B, a lower isolation region 15 filling the lower trench region 6 may be formed. For example, an oxide layer 9 may be formed on an inner wall of the lower trench region 6, and a lower isolation layer 12 filling the lower trench region 6 may be formed on the oxide layer 9. The oxide layer 9 may be formed of a silicon oxide layer using a thermal oxidation process.

In some embodiments, the lower isolation layer 12 may be formed of a silicon layer. For example, the lower isolation layer 12 may be formed of a polysilicon layer using a CVD or ALD process.

In other embodiments, the lower isolation layer 12 may be formed of an insulating material, e.g., a silicon oxide layer using a spin coating process, a CVD process or an ALD process.

The first mask 3 may be removed. When the first mask 3 is formed of silicon nitride, the first mask 3 may be removed using an etch process.

Figure 7A:
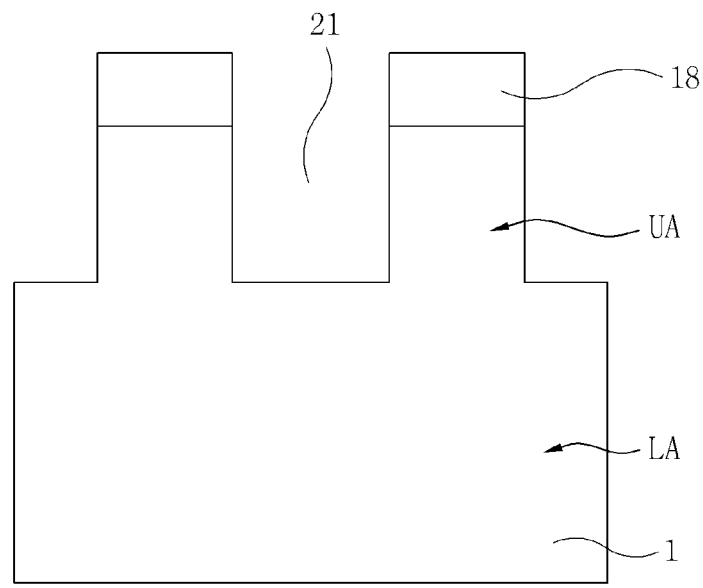
Figure 7B:
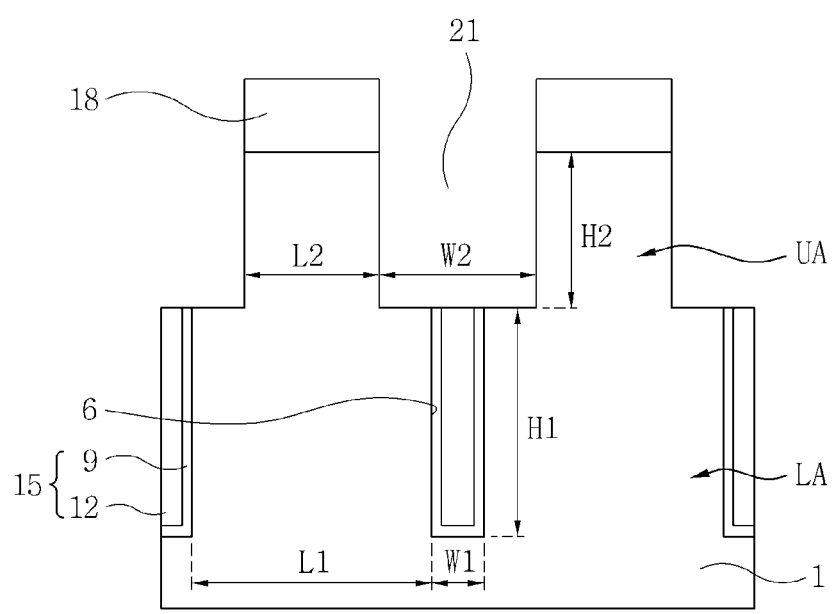

Referring to FIGS. 2, 7A and 7B, a second mask 18 may be formed on the substrate having the lower isolation region 15. The second mask 18 may be formed of silicon nitride. The semiconductor substrate 1 and the lower isolation region 15 may be etched using the second mask 18 as an etch mask. As a result, an upper trench region 21 may be formed. The width W2 of the upper trench region 21 may be greater than the width W1 of the lower trench region 6.

In some embodiments, the height H2 of the upper trench region 21 may be smaller than the height H1 of the lower trench region 6. That is, the vertical height H2 of the upper trench region 21 may be smaller than the vertical height H1 of the lower trench region 6 disposed below the upper trench region 21 in the semiconductor substrate 1.

The lower active regions LA may be defined by the lower trench regions 6 and the upper active regions UA may be defined by the upper trench region 21.

Viewed from a plan view, each of the lower active regions LA may be in the shape of a line. The upper active regions UA may be shaped to upwardly protrude from parts of the lower active regions LA.

Each of the lower active regions LA may be formed to a first width L1, and each of the upper active regions UA may be formed to a second width L2 smaller than the first width L1. Sidewalls of the lower active regions LA may not be vertically aligned with those of the upper active regions UA. In other words, the sidewalls of the lower active region LA may be offset from the sidewalls of the upper active region UA in a horizontal direction. Therefore, as illustrated in FIG. 7B, a difference in width between the upper and lower active regions UA and LA may cause parts of top surfaces of the lower active regions LA to be exposed.

Figure 8A:
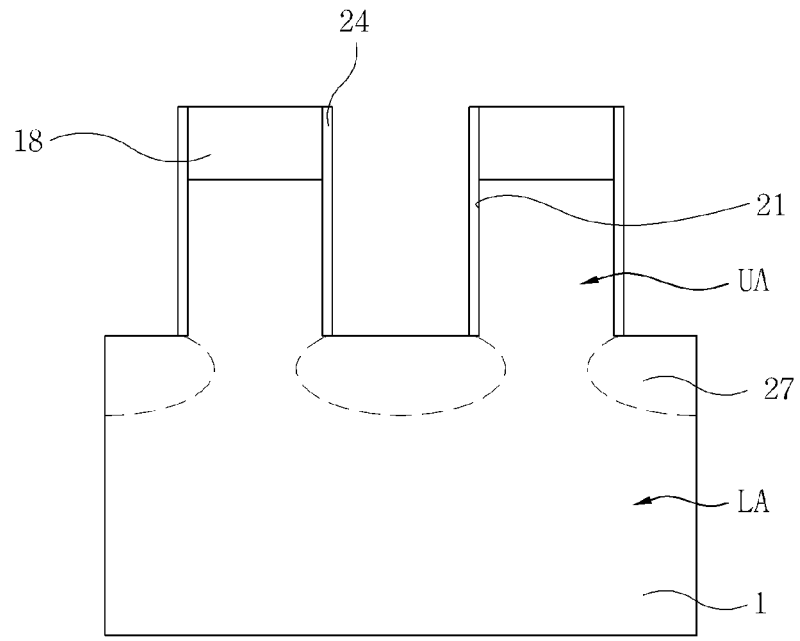
Figure 8B:
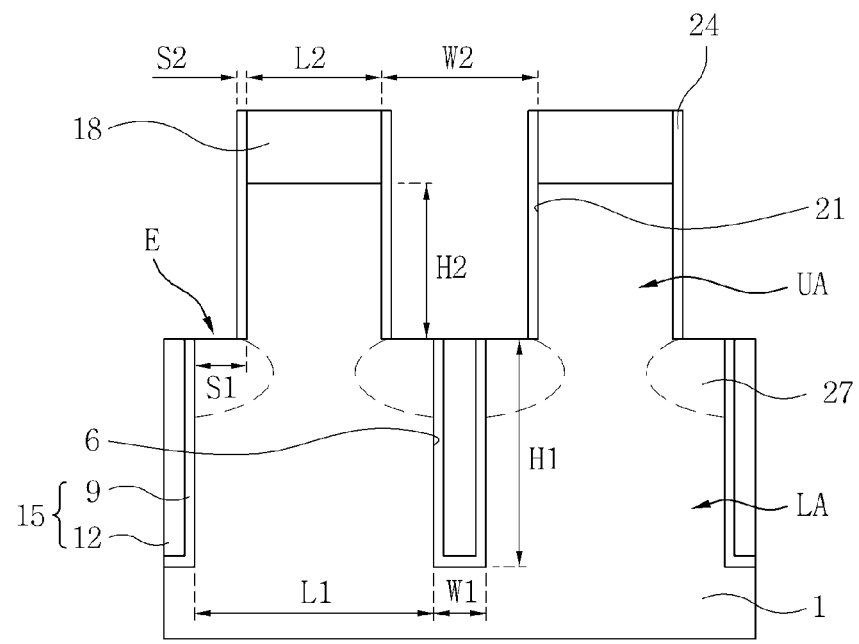

Referring to FIGS. 2, 8A and 8B, a spacer 24 may be formed on a sidewall of the upper trench region 21. The spacer 24 may be formed of an insulating material such as silicon oxide or silicon nitride.

The width S2 of the spacer 24 may be smaller than a distance S1 between the sidewalls of the lower active regions LA and the sidewalls of the upper active regions UA. Therefore, a part E of the top surfaces of the lower active regions LA may be exposed.

Impurities may be implanted into the lower active regions LA using an ion implantation process to form preliminary impurity regions 27. More specifically, impurities may be implanted through the exposed regions E of the top surfaces of the lower active regions LA, so that the preliminary impurity regions 27 may be formed. The ion implantation process may be an inclined ion implantation process. During the ion implantation process for forming the preliminary impurity regions 27, the second mask 18 and the spacer 24 may function as ion implantation masks for protecting the upper active regions UA. The spacer 24 may prevent the sidewalls of the upper active regions UA from being damaged by the ion implantation process. Moreover, the spacer 24 may prevent impurities from being implanted into the upper active regions UA.

In other embodiments, the formation of the spacer 24 may be omitted. For example, when an ion implantation process in which impurities are implanted into the lower active regions LA in a vertical direction to the semiconductor substrate 1 is performed, the formation of the spacer 24 may be omitted.

Figure 9A:
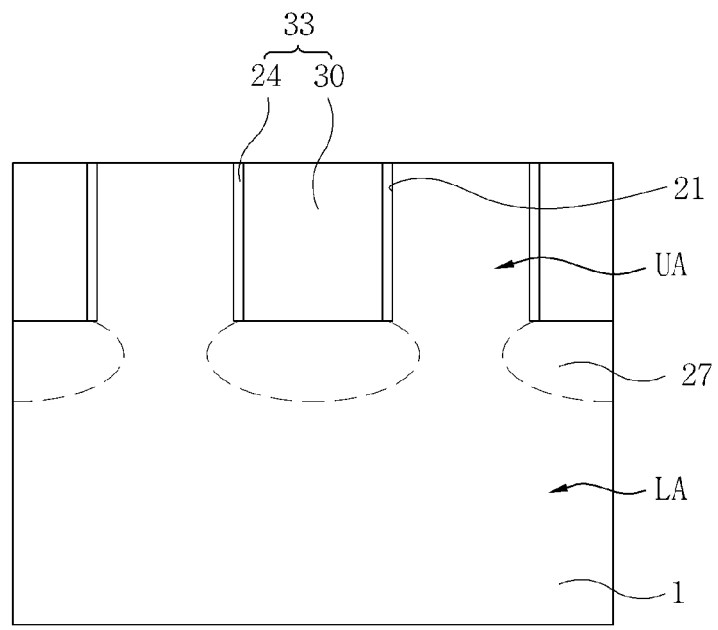
Figure 9B:
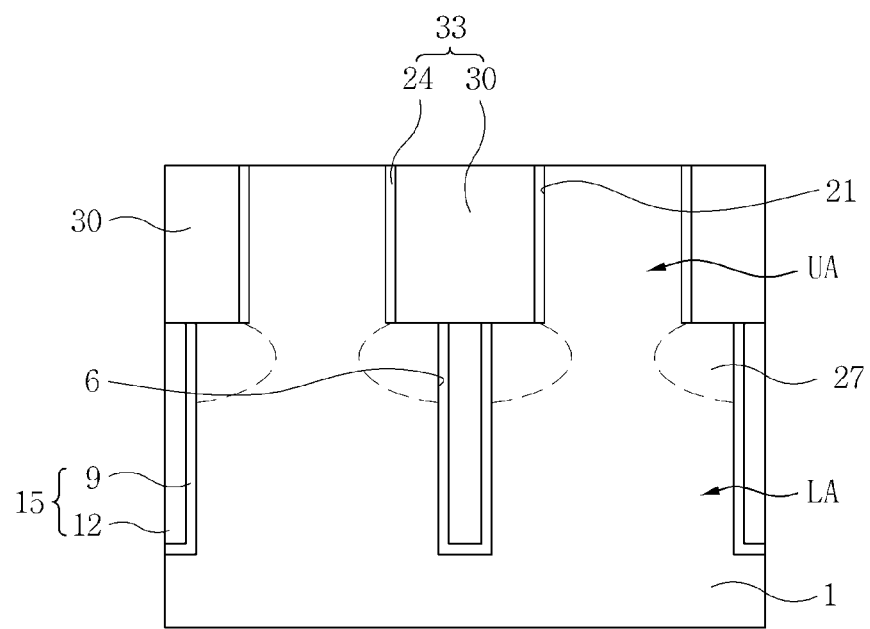

Referring to FIGS. 2, 9A and 9B, an insulating material layer may be formed on the substrate having the preliminary impurity regions 27, and the insulating material layer may be planarized to form an upper isolation layer 30 filling the upper trench region 21. The upper isolation layer 30 may be formed of an insulating oxide. For example, the upper isolation layer 30 may be formed of a silicon oxide layer. The upper isolation layer 30 and the spacer 24 may constitute an upper isolation region 33.

Then, the second mask 18 may be removed. When the second mask 18 is formed of silicon nitride, the second mask 18 may be removed using an etch process.

Referring to FIGS. 2, 10A and 10B, second preliminary impurity regions may be implanted into the upper active regions UA, and an annealing process may be performed to activate the second preliminary impurity regions and the first preliminary impurity regions 27. As a result, first impurity regions 27' provided in the lower active regions LA and extending into the upper active regions UA may be formed, and second impurity regions 42 may be formed in the remaining regions of the upper active regions UA in which the first impurity regions 27' are not formed.

The first impurity regions 27' and the second impurity regions 42 may constitute a diode as illustrated in FIGS. 1 and 2. For example, the first impurity regions 27' may have a different conductivity from the semiconductor substrate 1, i.e., N+-type impurity regions, and the second impurity regions 42 may be P-type impurity regions.

In some embodiments, each of the second impurity regions 42 may be formed of a P−-type low-concentration impurity region 36 and a P+-type high-concentration impurity region 39.

Junctions between the first impurity regions 27' and the second impurity regions 42 may be not flat. Viewed from a vertical cross-sectional view, the junctions between the first impurity regions 27' and the second impurity regions 42 may be in the shape of bent lines. For example, the junctions between the first impurity regions 27' and the second impurity regions 42 may have central portions that are downwardly concave.

The lower isolation regions 15 and the second impurity regions 42 may function to electrically insulate the first impurity regions 27' that are spaced apart from each other. The first impurity regions 27' may correspond to the word lines WL1, WL2, . . . , WLm of FIGS. 1 and 2.

Referring to FIGS. 2, 11A and 11B, a first interlayer insulating layer 45 may be formed on the entire surface of the semiconductor substrate having the first and second impurity regions 27' and 42 constituting the diode. The interlayer insulating layer 45 may include a silicon oxide layer.

Lower conductive patterns 48 penetrating the first interlayer insulating layer 45 and electrically connected to the second impurity regions 42 may be formed. The lower conductive patterns 48 may include a metal-semiconductor compound such as CoSi, TiSi, IrSi, PtSi or NiSi forming ohmic contact with the second impurity regions 42 and a metal layer such as tungsten formed on the metal-semiconductor compound.

A second interlayer insulating layer 51 may be formed on the first interlayer insulating layer 45. The second interlayer insulating layer 51 may be formed of silicon oxide. Lower electrodes 54 penetrating the second interlayer insulating layer 51 and electrically connected to the lower conductive patterns 48 may be formed. The lower electrodes 54 may be formed of one selected from the group consisting of a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer and a combination thereof.

Information storage material patterns 57 and S and upper electrodes 60 which are sequentially stacked may be provided on the substrate having the lower electrodes 54. The information storage material patterns 57 and S may include a phase-change material layer whose resistance to a flowing current varies depending on a phase. The phase-change material layer may be formed of a material layer including at least one of Te, Se, Ge, Sb, Bi, Pb, Sn, Ag, As, S, Si, P, O and C. For example, the phase-change material layer may be used for a phase-change memory cell in addition to a chalcogenide layer such as a GST layer. The upper electrodes 60 may be formed of one selected from the group consisting of a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and a combination thereof.

In some embodiments, the information storage material patterns 57 may be formed in the shape of lines spaced apart from each other. For example, viewed from a plan view, the information storage material patterns 57 may be formed in the shape of lines having a second orientation Y crossing the word lines WL1, WL2, . . . , WLm of the first orientation X. The information storage material patterns 57 may correspond to "S" of FIG. 2.

In other embodiments, the information storage material patterns 57 may be spaced apart from each other to be in an island type.

A third interlayer insulating layer 63 covering the information storage material patterns 57 and S and the upper electrodes 60 may be formed. The third interlayer insulating layer 63 may be formed of a silicon oxide layer. Conductive upper plugs 66 penetrating the third interlayer insulating layer 63 and electrically connected to the upper electrodes 60 may be formed.

Bit lines 69 covering the upper plugs 66 may be formed on the third interlayer insulating layer 63. The bit lines 69 may correspond to the bit lines BL1, BL2, . . . , BLn of FIGS. 1 and 2.

Viewed from a plan view, parts of the information storage material patterns 57 disposed at the cross points of the word lines WL1, WL2, . . . , WLm; 27' and the bit lines BL1, BL2, . . . , BLn; 69 may be defined as information storage elements Rp.

Next, a method of fabricating a semiconductor device according to another embodiment of the inventive concept will be described with reference to FIGS. 12A and 12B.

Referring to FIGS. 2, 12A, and 12B, a method of forming first and second impurity regions in a different manner from that of forming the first and second impurity regions 27' and 42 in the previous embodiment may be provided. More specifically, before forming the lower trench regions 6 described with reference to FIGS. 5A and 5B, an ion implantation process for forming first and second impurity regions 80 and 89 may be performed. Therefore, during the ion implantation process for forming the first impurity regions 80, since there is no ion implantation mask such as the first mask 18 of FIGS. 8A and 8B, the first impurity regions 80 may be formed to a uniform thickness in the semiconductor substrate 1. That is, while the junction between the between the first impurity regions 27' and the second impurity regions 42 may be not flat form, a junction between the first impurity regions 80 and the second impurity regions 89 may be in a non-concave form, i.e., a horizontal line. Each of the second impurity regions 89 may include a low-concentration lower impurity region 83 and a high-concentration upper impurity region 86.

Since the embodiment illustrated in FIGS. 12A and 12B is the same as those of FIGS. 5A to 11B except for a method of forming the first impurity regions 80 and the second impurity regions 89, the detailed descriptions thereof will be omitted.

A method of fabricating a semiconductor device according to still another embodiment will be described with reference to FIGS. 13A to 15B.

Figure 13A:
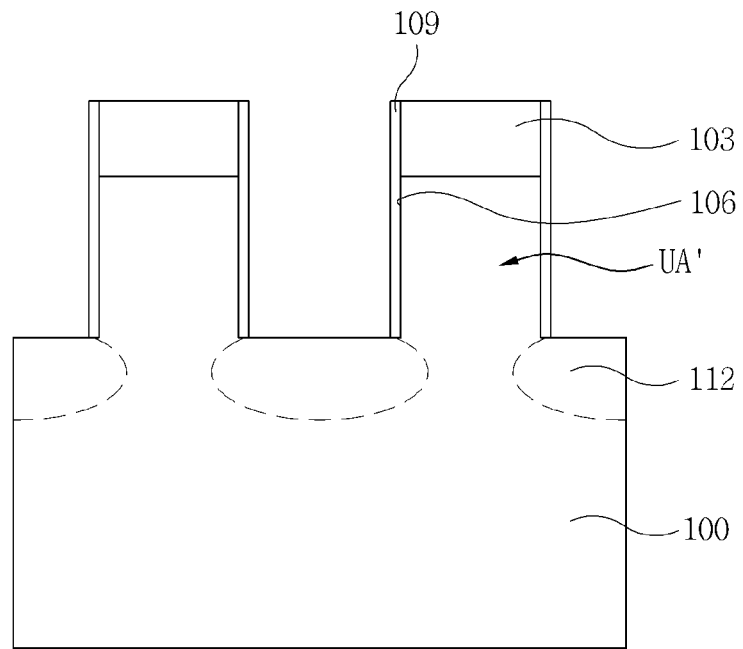
FIGS. 13A to 15B are cross-sectional views of a semiconductor device according to still another embodiment of the general inventive concept.
Figure 13B:
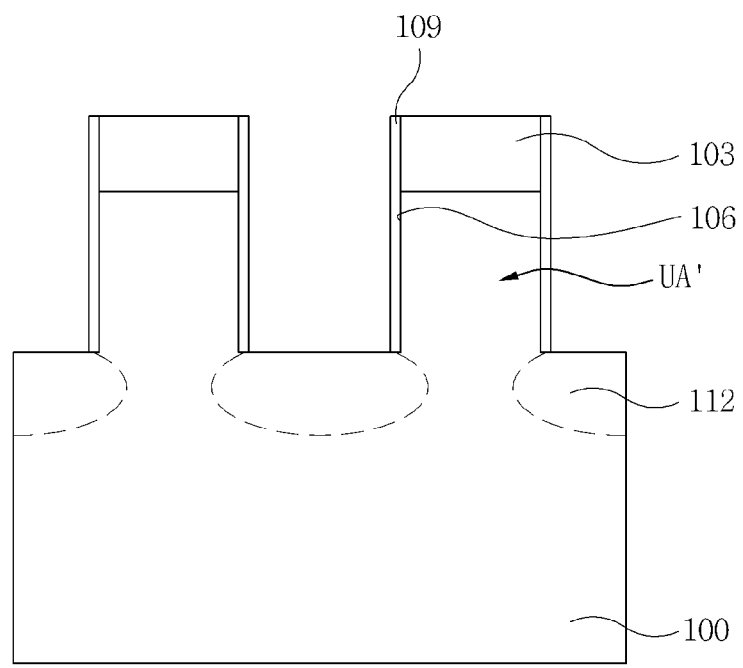

Referring to FIGS. 2, 13A and 13B, a first mask 103 may be formed on a semiconductor substrate 100. The first mask 103 may be formed of silicon nitride.

The semiconductor substrate 100 may be etched using the first mask 103 as an etch mask. As a result, an upper trench region 106 defining upper active regions UA' may be formed.

A spacer 109 may be formed on a sidewall of the upper trench region 106. The spacer 109 may be formed of an insulating material such as silicon oxide or silicon nitride.

Impurities may be implanted into the semiconductor substrate 100 using an ion implantation process to form first preliminary impurity regions 112. The ion implantation process may be an inclined ion implantation process.

During the ion implantation process for forming the first preliminary impurity regions 112, the first mask 103 and the spacer 109 may function as ion implantation masks for protecting the upper active regions UA'.

In other embodiments, as illustrated in FIGS. 12A and 12B, before forming the first mask 103, an ion implantation process for forming impurity regions may be performed.

Figure 14A:
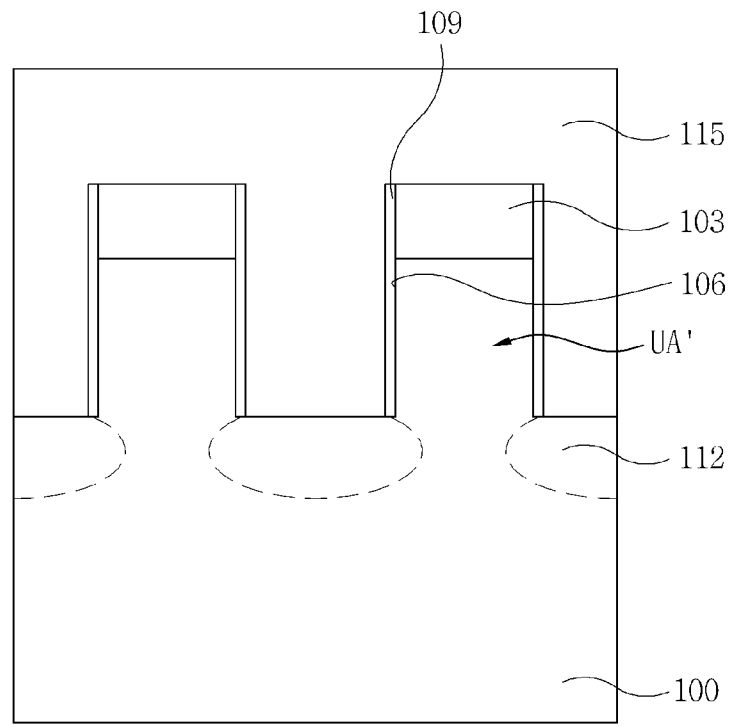
Figure 14B:
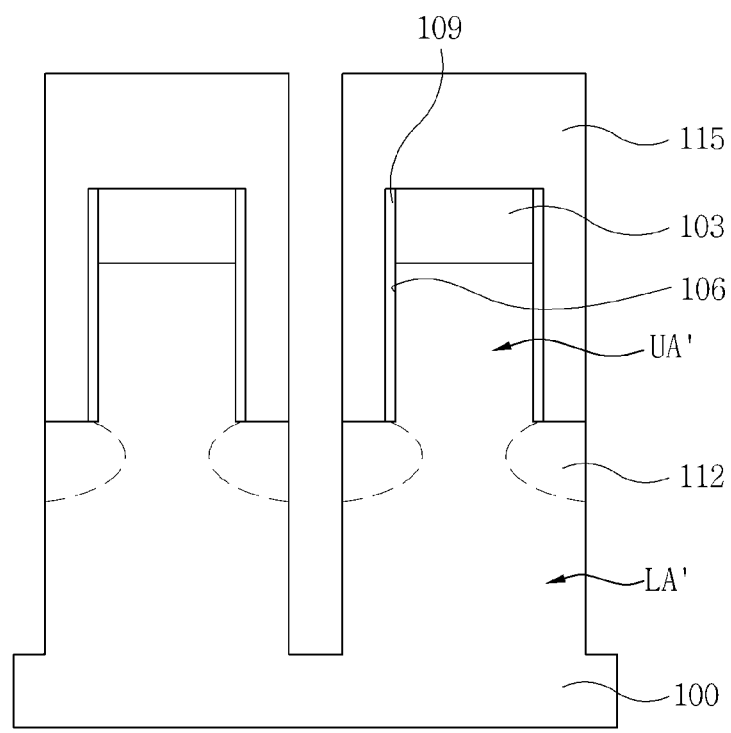

Referring to FIGS. 2, 14A and 14B, a second mask 115 having an opening crossing between the upper active regions UA' may be formed. The second mask 115 may be formed of a spin on hardmask (SOH) layer containing carbon or a photoresist layer. Alternatively, the second mask 115 may be formed of a mask having a stacked structure.

The semiconductor mask between the upper active regions UA' may be etched using the second mask 115 as an etch mask to form a lower trench region 118. Lower active regions LA' may be defined by the lower trench region 118. Here, since the upper and lower active regions UA' and LA' are substantially equal in shape to the upper and lower active regions UA and LA described with reference to FIGS. 5A to 11B, the detailed descriptions thereof will be omitted.

Figure 15A:
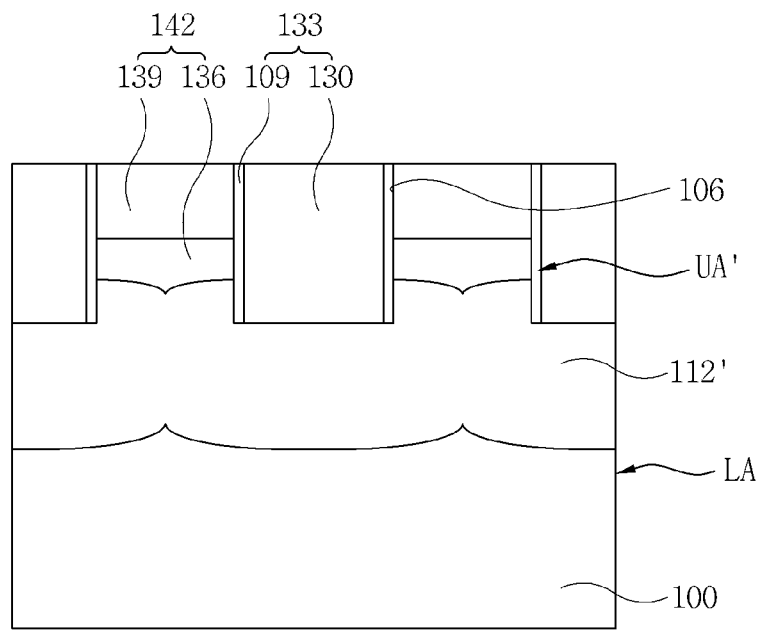
Figure 15B:
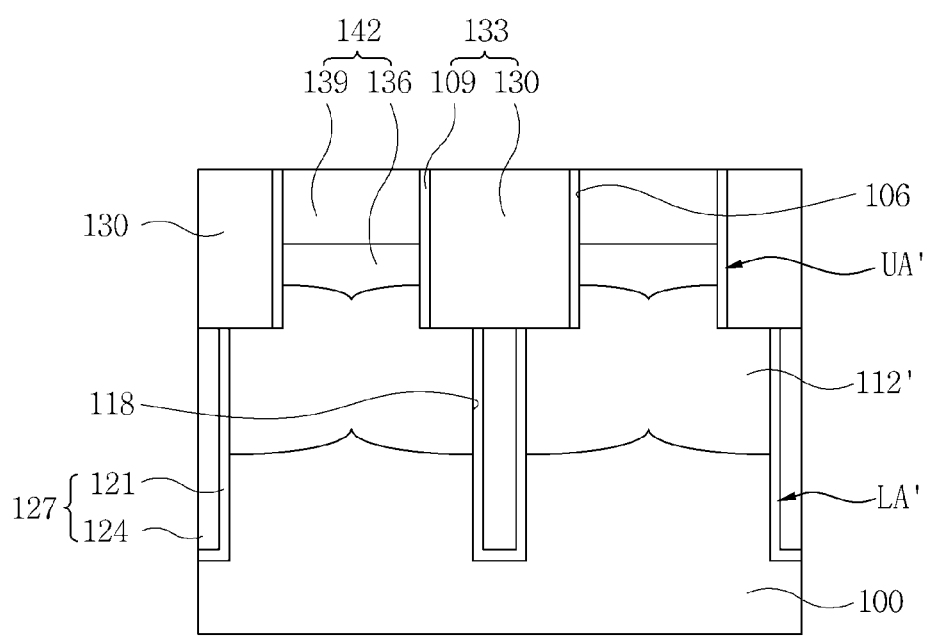

Referring to FIGS. 2, 15A and 15B, the second mask 115 may be removed. A thermal oxidation process may be performed to form a thermal oxidation layer 121 on the exposed inner walls of the lower and upper trench regions 118 and 106.

Insulating material layers 124 and 130 such as silicon oxide filling the lower and upper trench regions 118 and 106 may be formed. The insulating material layers 124 and 130 may be formed using a spin coating method.

In other embodiments, a lower isolation layer 124 filling the lower trench region 118 may be formed on the thermal oxidation layer 121. The lower isolation layer 124 may be formed of a material such as polysilicon exhibiting excellent gap fill properties. For example, a polysilicon layer may be formed on the substrate having the thermal oxidation layer 121, and the polysilicon layer may be partially etched to remain the polysilicon layer in the lower trench region 118, so that the lower isolation layer 124 may be formed. Here, the lower isolation layer 124 and the thermal oxidation layer 121 may constitute a lower isolation region 127. Then, an upper isolation layer 130 filling an empty space of the upper trench region 106 on the lower isolation region 127 may be formed. The upper isolation layer 130 and the spacer 109 may constitute an upper isolation region 133.

The first mask 103 may be removed.

Second preliminary impurity regions may be implanted into the upper active regions UA', and an annealing process may be performed to activate the second preliminary impurity regions and the first preliminary impurity regions 112. As a result, first impurity regions 112' provided in the lower active regions LA' and extending into the upper active regions UA' may be formed, and second impurity regions 142 may be formed in the remaining regions of the upper active regions UA' where the first impurity regions 112' are not formed. Each of the second impurity regions 142 may be formed of a P--type low concentration impurity region 136 and a P+-type high concentration impurity region 139 which are sequentially stacked.

Since the first and second impurity regions 112' and 142 correspond to the first and second impurity regions 27' and 42 described with reference to FIGS. 10A and 10B, respectively, they may be easily understood from the descriptions of FIGS. 10A and 10B.

Figure 16:
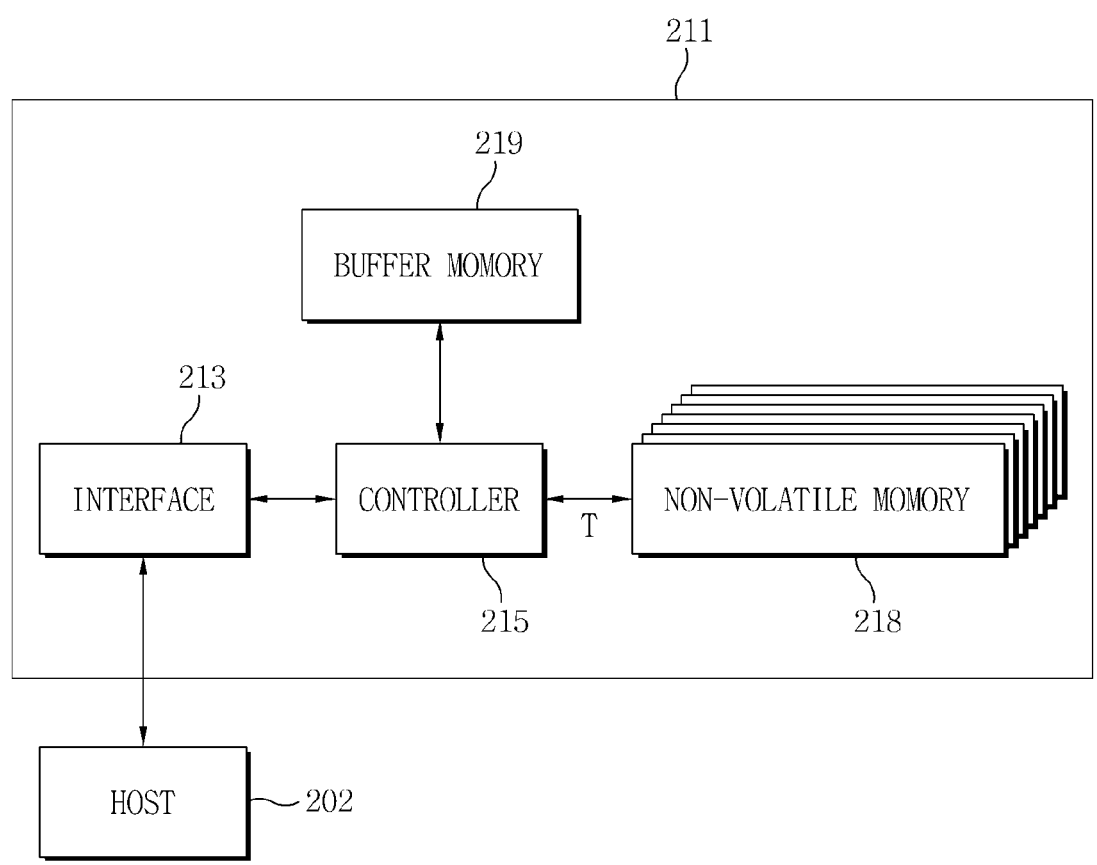
FIG. 16 is a schematic block diagram of an electronic system employing a semiconductor device according to embodiments of the general inventive concept.

FIG. 16 is a schematic block diagram of an electronic system employing a semiconductor device according to embodiments of the inventive concept. The electronic system may be a data storage device such as a solid state disk (SSD) 211.

Referring to FIG. 16, the SSD 211 may include an interface 213, a controller 215, a non-volatile memory 218, and a buffer memory 219. The non-volatile memory 218 may employ a diode D described in the embodiments of the inventive concept as a switching device.

The non-volatile memory 218 may be a resistive memory. For example the non-volatile memory 218 may include a data storage element selected from the group consisting of a phase-change material pattern, a magnetic tunnel junction (MTJ) pattern, a polymer pattern and an oxide pattern.

The SSD 211 is a device that stores information using a semiconductor. The SSD 211 is superior to a hard disk drive (HDD) in terms of speed, mechanical delay, error rate, generation of heat, noise, and compact size and light weight. The SSD 211 may be used for a notebook PC, a desk top PC, an MP3 player or a portable storage device.

The controller 215 may be formed to be adjacent to the interface 213 and to be electrically connected thereto. The controller 215 may include a memory controller and a buffer controller. The non-volatile memory 218 may be formed to be adjacent to the controller 215 and to be electrically connected thereto. A data storage capacity of the SSD 211 may correspond to the non-volatile memory 218. The buffer memory 219 may be formed to be adjacent to the controller 215 and to be electrically connected thereto The interface 213 may be connected to a host 202 and may function to transmit and receive electrical signals such as data. For example, the interface 213 may be a device that uses a standard such as SATA, IDE, SCSI and/or a combination thereof. The non-volatile memory 218 may be connected to the interface 213 via the controller 215. The non-volatile memory 218 may function to store data received via the interface 213. The non-volatile memory 218 is characterized by maintaining data stored therein even when power supplied to the SSD 211 is completely cut off.

The buffer memory 219 may include a volatile memory. The volatile memory may be a dynamic random access memory (DRAM) and/or a static random access memory (SRAM). The buffer memory 219 exhibits a faster operating rate than the non-volatile memory 218.

A data processing rate of the interface 213 may be faster than the operating rate of the non-volatile memory 218. Here, the buffer memory 219 may function to preliminarily store data. The data received via the interface 213 may be preliminarily stored in the buffer memory 219 via the controller 215, and may keep pace with a data writing rate of the non-volatile memory 218 to be permanently stored in the non-volatile memory 218. Moreover, data frequently used among data stored in the non-volatile memory 218 may be read in advance to be preliminarily stored in the buffer memory 219. That is, the buffer memory 219 may function to increase an effective operating rate of the SSD 211 and to reduce an error rate.

Figure 17:
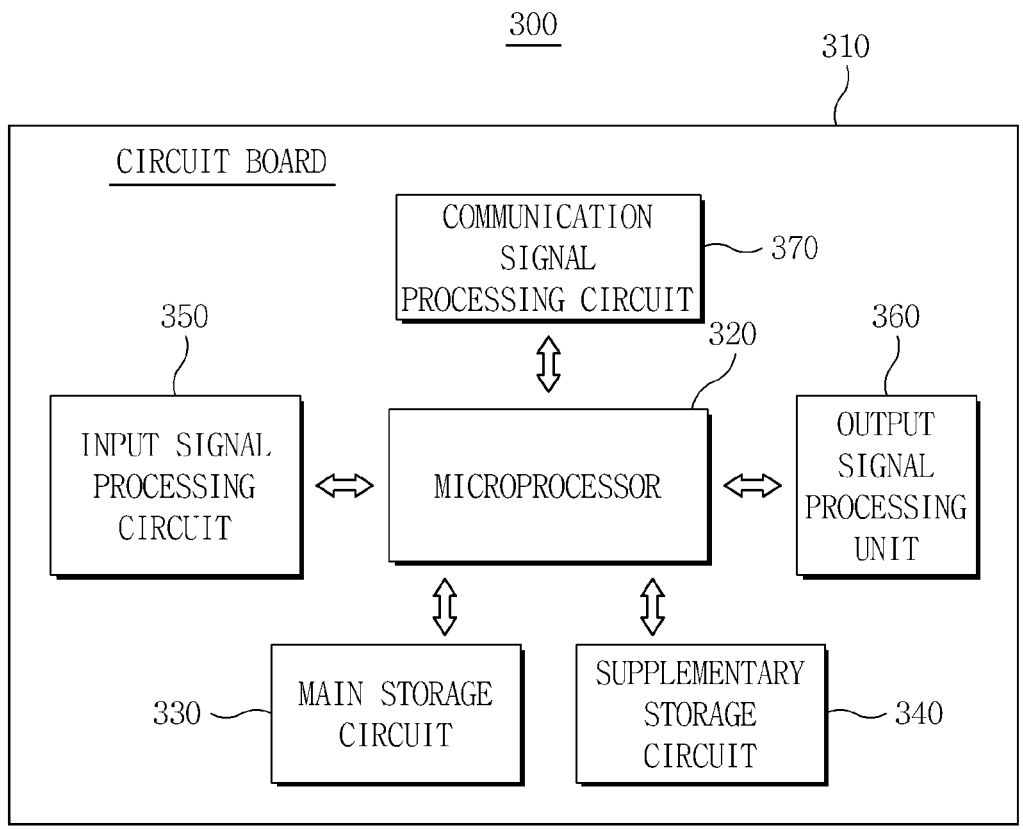
FIG. 17 is a schematic block diagram of an electronic circuit board according to embodiments of the general inventive concept.

FIG. 17 is a schematic block diagram of an electronic circuit board. Referring to FIG. 17, an electronic circuit board 300 may be provided. The electronic circuit board 300 includes a microprocessor 320 disposed on a circuit board 310, a main storage circuit 330 and a supplementary storage circuit 340 communicating with the microprocessor 320, an input signal processing circuit 350 transmitting a command to the microprocessor 320, an output signal processing circuit 360 receiving a command from the microprocessor 320 and a communication signal processing circuit 370 transmitting and receiving electrical signals to and from other circuit boards. It may be understood that arrows denote a path through which electrical signals are transmitted.

The microprocessor 320 may receive and process various electrical signals, output the results, and control the other elements of the electronic circuit board 310. For example, it may be understood that the microprocessor 320 corresponds to a central processing unit (CPU) and/or a main control unit (MCU). The main storage circuit 330 may temporarily store data that the microprocessor 320 always or frequently requires or data before and after processing. The main storage circuit 330 requires a high-speed response, and thus may be formed of a semiconductor memory. More specifically, the main storage circuit 330 may be formed of a semiconductor memory referred to as a cache, an SRAM, a DRAM, a resistive random access memory (RRAM) and applied semiconductor memories thereof, e.g., utilized RAM, ferro-electric RAM, fast cycle RAM, phase changeable RAM, magnetic RAM, and other semiconductor memories. Furthermore, the main storage circuit 330 may include a volatile or non-volatile RAM. Therefore, the main storage circuit 330 may include a memory device formed using the device and/or the fabricating method thereof according to at least one embodiment of the inventive concept. The main storage circuit 330 may include at least one semiconductor module. The supplementary storage circuit 340 is a high-capacity memory device, and may be a non-volatile semiconductor memory such as a flash memory or a phase-change memory or an HDD using a magnetic field. Alternatively, the supplementary storage circuit 340 may be a compact disc drive using light. Compared to the main storage circuit 330, the supplementary storage circuit 340 does not require high speed, but it may be used to store high-capacity data.

The supplementary storage circuit 340 may have no relation to randomness/non-randomness and may include a nonvolatile memory device. The supplementary storage circuit 340 may include at least one semiconductor module. The input signal processing circuit 350 may convert an external command into an electrical signal or transfer an externally received electrical signal to the microprocessor 320. The externally received command or electrical signal may be an operation command, an electrical signal to be processed or data to be stored. The input signal processing circuit 350, for example, may be a terminal signal processing circuit processing a signal transmitted from a keyboard, a mouse, a touch pad, an image recognition device or various sensors, an image signal processing circuit processing an input of an image signal from a scanner or camera, or various sensors or input signal interfaces.

The output signal processing circuit 360 may be an element for externally transmitting an electrical signal processed by the microprocessor 320. For example, the output signal processing circuit 360 may be a graphics card, an image processor, an optical converter, a beam panel card, or an interface circuit of various functions. The communication signal processing circuit 370 is an element for directly transmitting or receiving an electrical signal to or from other electronic systems or other circuit boards without using the input signal processing circuit 350 and the output signal processing circuit 360. For example, the communication signal processing circuit 370 may be a modem of a personal computer system, a LAN card or various interface circuits.

Figure 18:
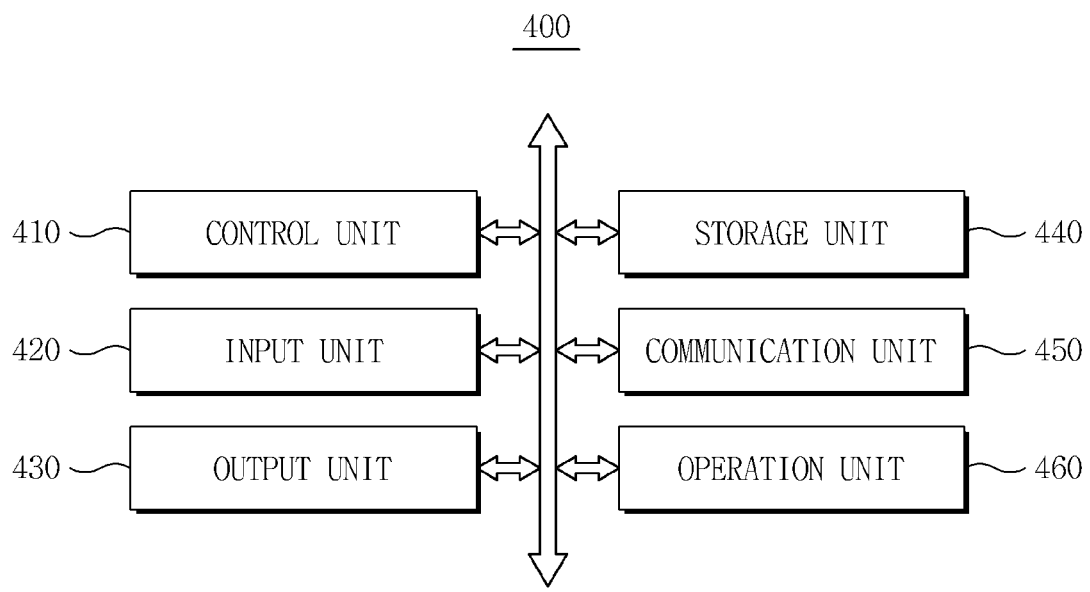
FIG. 18 is a schematic block diagram of an electronic system employing a semiconductor device according to embodiments of the general inventive concept.

FIG. 18 is a schematic block diagram of an electronic system. Referring to FIG. 18, an electronic system 400 may further include a control unit 410, an input unit 420, an output unit 430, a storage unit 440, a communication unit 450 and/or an operation unit 460.

The control unit 410 may generally control the electronic system 400 and each unit. The control unit 410 may be understood as a central processing unit or a central control unit, and may include the electronic circuit board 300. The input unit 420 may transmit an electrical command signal to the control unit 410. The input unit 420 may be a keyboard, a key pad, a mouse, a touch pad, an image recognition device such as a scanner or various input sensors. The output unit 430 may receive an electrical command signal from the control unit 410, and may output the result processed by the electronic system 400. The output unit 430 may be a monitor, a printer, a beam irradiator or various mechanical devices. The storage unit 440 may be an element for temporarily or permanently storing an electrical signal to be processed or processed by the control unit 410. The storage unit 440 may be physically or electrically connected to or combined with the control unit 410. The storage unit 440 may be a semiconductor memory, a magnetic memory device such as a hard disk, an optical storage device such as a compact disc or a server having a data storage function. The storage unit 440 may include a semiconductor memory formed using the device and/or the fabrication method according to at least one of the embodiments of the inventive concept.

The communication unit 450 may receive an electrical command signal from the control unit 410 and may transmit or receive the received electrical signal to or from other electronic systems. The communication unit 450 may be a wired transceiver such as a modem or a LAN card, or a wireless transceiver such as WiBro interface or an infrared port. The operation unit 460 may physically or mechanically operate according to the command of the control unit 410. For example, the operation unit 460 may be an element that mechanically operates such as a plotter, an indicator, or an up/down operator. The electronic system according to the inventive concept may be a computer, a network server, a networking printer or scanner, a wireless controller, a mobile communication terminal, an exchanger or an electronic product that performs programmed operations.

According to embodiments of the inventive concept, a diode and an isolation region that can be formed without using a high-temperature epitaxial process can be provided. Moreover, lower isolation regions disposed at both sides of an impurity regions used as word lines of a memory device can be formed to a narrower width than upper isolation regions. Therefore, since the impurity regions defined by the lower isolation regions, i.e., the word lines, can be formed to have great widths, electrical properties of the word lines can be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor device comprising:
 a lower active region on a semiconductor substrate;
 a plurality of upper active regions protruding from a top surface of the lower active region and having a narrower width than the lower active region;
 a lower isolation region on a sidewall of the lower active region;
 an upper isolation region provided on the lower isolation region, surrounding sidewalls of the upper active regions, and having a greater width than a top surface of the lower isolation region;
 a first impurity region provided in the lower active region and extending into the upper active regions; and
 second impurity regions formed in the upper active regions and constituting a diode together with the first impurity region.

2. The device of claim 1, wherein the second impurity regions include a lower impurity region and an upper impurity region having a higher concentration than the lower impurity region, the lower impurity region being interposed between the first impurity region and the upper impurity region.

3. The device of claim 1, wherein the first impurity region is disposed at a higher level than a bottom surface of the lower isolation region and is in a line shape in a plan view.

4. The device of claim 1, wherein the first impurity region and the second impurity region have a junction in an uneven form therebetween.

5. The device of claim 1, wherein the first impurity region and the second impurity region have a junction in the shape of a horizontal line therebetween.

6. The device of claim 1, wherein the upper isolation region includes an insulating upper isolation layer and an insulating spacer interposed between the upper isolation layer and the upper active regions.

7. The device of claim 1, wherein the lower active region is in a line shape in a plan view, and each of the upper active regions has a narrower width than the lower active region and upwardly protrudes from a top surface of the lower active region.

8. The device of claim 1, wherein sidewalls of the lower active region are offset from sidewalls of the upper active region in the horizontal direction.

9. A semiconductor device comprising:
a lower isolation region provided in a semiconductor substrate and defining lower active regions in the shape of lines spaced apart from each other;
an upper isolation region defining a plurality of upper active regions protruding from top surfaces of the lower active regions, and having a greater width than a top surface of the lower isolation region;
first impurity regions provided in the lower active regions and extending into the upper active regions; and
second impurity regions formed in the upper active regions and constituting a diode together with the first impurity regions.

10. The device of claim 9, wherein the first and second impurity regions have a junction disposed in the upper active regions.

11. The device of claim 9, wherein the first impurity regions are disposed at a higher level than a bottom surface of the lower isolation region.

12. The device of claim 9, wherein the lower isolation region includes a polysilicon layer and an insulating oxide layer surrounding a sidewall and bottom surface of the polysilicon layer.

13. The device of claim 9, wherein the upper isolation region includes an insulating upper isolation layer and an insulating spacer interposed between the upper isolation layer and the upper active regions.

14. The device of claim 9, wherein sidewalls of the lower active regions are not vertically aligned with sidewalls of the upper active region.

15. A semiconductor device, comprising:
a substrate having a first surface and a second surface opposite the first surface;
a plurality of upper isolation regions extending into the substrate from the first surface to define an upper active region between the plurality of first isolation regions;
a plurality of lower isolation regions extending toward the second surface from the plurality of upper isolation regions to define a lower active region between the plurality of lower isolation regions, and the plurality of lower isolation regions having top surface widths less than widths of the upper isolation regions;
a first impurity region located in at least the lower active region and extending into the upper active region; and
a second impurity region formed in the upper active region to, in combination with the lower impurity region, form a diode.

16. The device of claim 15, wherein a junction of the first impurity region and the second impurity region is located in the upper active region.

17. The device of claim 15, wherein a lower edge of the first impurity region between two of the plurality of lower isolation regions has a concave shape.

18. A solid-state disk, comprising:
an interface to transmit data to and from a host device;
non-volatile memory to store data; and
a controller to control access of the host device to the non-volatile memory,
wherein the non-volatile memory comprises:
a substrate having a first surface and a second surface opposite the first surface;
a plurality of upper isolation regions extending into the substrate from the first surface to define an upper active region between the plurality of first isolation regions;
a plurality of lower isolation regions extending toward the second surface from the plurality of upper isolation regions to define a lower active region between the plurality of lower isolation regions, and the plurality of lower isolation regions having top surface widths less than widths of the upper isolation regions;
a first impurity region located in at least the lower active region and extending into the upper active region;
a second impurity region formed in the upper active region to, in combination with the lower impurity region, form a diode; and
an information storage material pattern connected to the upper active region.

19. The solid-state disk of claim 18, wherein the first impurity region is a word line that extends through the substrate to connect a plurality of lower active regions.

20. The solid-state disk of claim 18, wherein sidewalls of the lower active region are not vertically aligned with sidewalls of the upper active region.

* * * * *

UNITED STATES PATENT AND TRADEMARK OFFICE
CERTIFICATE OF CORRECTION

PATENT NO. : 8,921,816 B2  
APPLICATION NO. : 13/178762  
DATED : December 30, 2014  
INVENTOR(S) : Bo-Young Seo et al.

Page 1 of 1

It is certified that error appears in the above-identified patent and that said Letters Patent is hereby corrected as shown below:

On the Title page

Item (75) Inventors should read: Bo-Young Seo, Suwon-si (KR); Byung-Sup Shim, Yongin-si (KR); Yong-Kyu Lee, Gwacheon-si (KR); Tea-Kwang Yu, Hwaseong-si (KR); Ji-Hoon Park, Seongnam-si (KR)

Signed and Sealed this  
Twenty-first Day of April, 2015

Michelle K. Lee  
*Director of the United States Patent and Trademark Office*